US012581714B2

(12) United States Patent
Yang

(10) Patent No.: US 12,581,714 B2
(45) Date of Patent: Mar. 17, 2026

(54) SEMICONDUCTOR DEVICE AND METHOD OF MANUFACTURING THEREOF

(71) Applicant: Taiwan Semiconductor Manufacturing Company, Ltd., Hsinchu (TW)

(72) Inventor: Sheng-Jier Yang, Zhubei City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 162 days.

(21) Appl. No.: 18/631,808

(22) Filed: Apr. 10, 2024

(65) Prior Publication Data

US 2024/0266411 A1     Aug. 8, 2024

Related U.S. Application Data

(62) Division of application No. 17/367,869, filed on Jul. 6, 2021, now Pat. No. 11,984,483.

(Continued)

(51) Int. Cl.
H10D 30/67 (2025.01)
H10D 62/10 (2025.01)
(Continued)

(52) U.S. Cl.
CPC ....... H10D 64/258 (2025.01); H10D 30/6735 (2025.01); H10D 30/6737 (2025.01);
(Continued)

(58) Field of Classification Search
CPC ............. H10D 64/258; H10D 30/6735; H10D 30/6737; H10D 30/6743; H10D 30/6757;
(Continued)

(56) References Cited

U.S. PATENT DOCUMENTS 8,962,400 B2   2/2015  Tsai et al.
9,093,514 B2   7/2015  Tsai et al.
(Continued)

FOREIGN PATENT DOCUMENTS

TW        201729418 A      8/2017

OTHER PUBLICATIONS

Prosecution file history of U.S. Appl. No. 17/150,337, filed Jan. 15, 2021.
(Continued)

*Primary Examiner* — David Vu
(74) *Attorney, Agent, or Firm* — STUDEBAKER BRACKETT PLLC

(57) ABSTRACT

In a method of manufacturing a semiconductor device, a fin structure in which first semiconductor layers and second semiconductor layers are alternately stacked is formed, a sacrificial gate structure is formed over the fin structure, a source/drain region of the fin structure, which is not covered by the sacrificial gate structure, is etched thereby forming a source/drain space, a stressor layer is formed in the source/drain space, a metal gate structure including part of the second semiconductor layer as channel regions is formed by a gate replacement process, after the metal gate structure is formed, the stressor layer is at least partially removed, and a source/drain contact comprising metal or a metallic material is formed in the source/drain space from which the stressor layer is at least partially removed.

20 Claims, 30 Drawing Sheets

Related U.S. Application Data

(60) Provisional application No. 63/166,886, filed on Mar. 26, 2021.

(51) Int. Cl.
| | |
|---|---|
| *H10D 64/01* | (2025.01) |
| *H10D 64/23* | (2025.01) |
| *H10D 84/83* | (2025.01) |

(52) U.S. Cl.
CPC ..... *H10D 30/6743* (2025.01); *H10D 30/6757* (2025.01); *H10D 62/118* (2025.01); *H10D 64/01* (2025.01); *H10D 64/015* (2025.01); *H10D 64/017* (2025.01); *H10D 84/83* (2025.01)

(58) Field of Classification Search
CPC .... H10D 62/118; H10D 64/01; H10D 64/015; H10D 64/017; H10D 84/83; H10D 30/014; H10D 30/43; H10D 30/794; H10D 30/796; H10D 62/121; H10D 62/151; H10D 62/364; H10D 84/0149; H10D 84/0167; H10D 84/017; H10D 84/038; H10D 84/85; H10D 84/0128; H10D 84/0135; H10D 84/0158; B82Y 10/00
See application file for complete search history.

(56) References Cited

U.S. PATENT DOCUMENTS

| | | | |
|---|---|---|---|
| 9,236,267 B2 | 1/2016 | De et al. | |
| 9,245,805 B2 | 1/2016 | Yeh et al. | |
| 9,418,897 B1 | 8/2016 | Ching et al. | |
| 9,502,265 B1 | 11/2016 | Jiang et al. | |
| 9,520,466 B2 | 12/2016 | Holland et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 9,786,774 B2 | 10/2017 | Colinge et al. | |
| 9,812,363 B1 | 11/2017 | Liao et al. | |
| 9,853,101 B2 | 12/2017 | Peng et al. | |
| 9,859,380 B2 | 1/2018 | Lee et al. | |
| 9,881,993 B2 | 1/2018 | Ching et al. | |
| 11,508,621 B2 | 11/2022 | More | |
| 11,908,856 B2 * | 2/2024 | Guha | H10D 30/62 |
| 2012/0138886 A1 | 6/2012 | Kuhn et al. | |
| 2015/0069328 A1 | 3/2015 | Leobandung | |
| 2015/0137237 A1 | 5/2015 | Jacob et al. | |
| 2015/0380313 A1 | 12/2015 | Ching et al. | |
| 2018/0151378 A1 | 5/2018 | Huang et al. | |

OTHER PUBLICATIONS

Prosecution file history of U.S. Appl. No. 17/710,592, filed Mar. 31, 2022.

Notice of Allowance issued in U.S. Appl. No. 17/367,869 Jan. 10, 2024.

* cited by examiner

SEMICONDUCTOR DEVICE AND METHOD OF MANUFACTURING THEREOF

RELATED APPLICATIONS

This application claims priority to U.S. application Ser. No. 17/367,869 filed on Jul. 6, 2021, which claims priority to U.S. Provisional Patent Application No. 63/166,886 filed on Mar. 26, 2021, the entire contents of which are incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a fin FET (Fin FET) and a gate-all-around (GAA) FET. In a Fin FET, a gate electrode is adjacent to three side surfaces of a channel region with a gate dielectric layer interposed therebetween. Because the gate structure surrounds (wraps) the fin on three surfaces, the transistor essentially has three gates controlling the current through the fin or channel region. Unfortunately, the fourth side, the bottom part of the channel is far away from the gate electrode and thus is not under close gate control. In contrast, in a GAA FET, all side surfaces of the channel region are surrounded by the gate electrode, which allows for fuller depletion in the channel region and results in less short-channel effects due to steeper sub-threshold current swing (SS) and smaller drain induced barrier lowering (DIBL). As transistor dimensions are continually scaled down, further improvements of the GAA FET are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1A is a cross sectional view along the X direction (source-drain direction), FIG. 1B is a cross sectional view corresponding to Y1-Y1 of FIG. 1A, FIG. 1C is a cross sectional view corresponding to Y2-Y2 of FIG. 1A and FIG. 1D shows a cross sectional view corresponding to Y3-Y3 of FIG. 1A

DETAILED DESCRIPTION

Figure 1A:
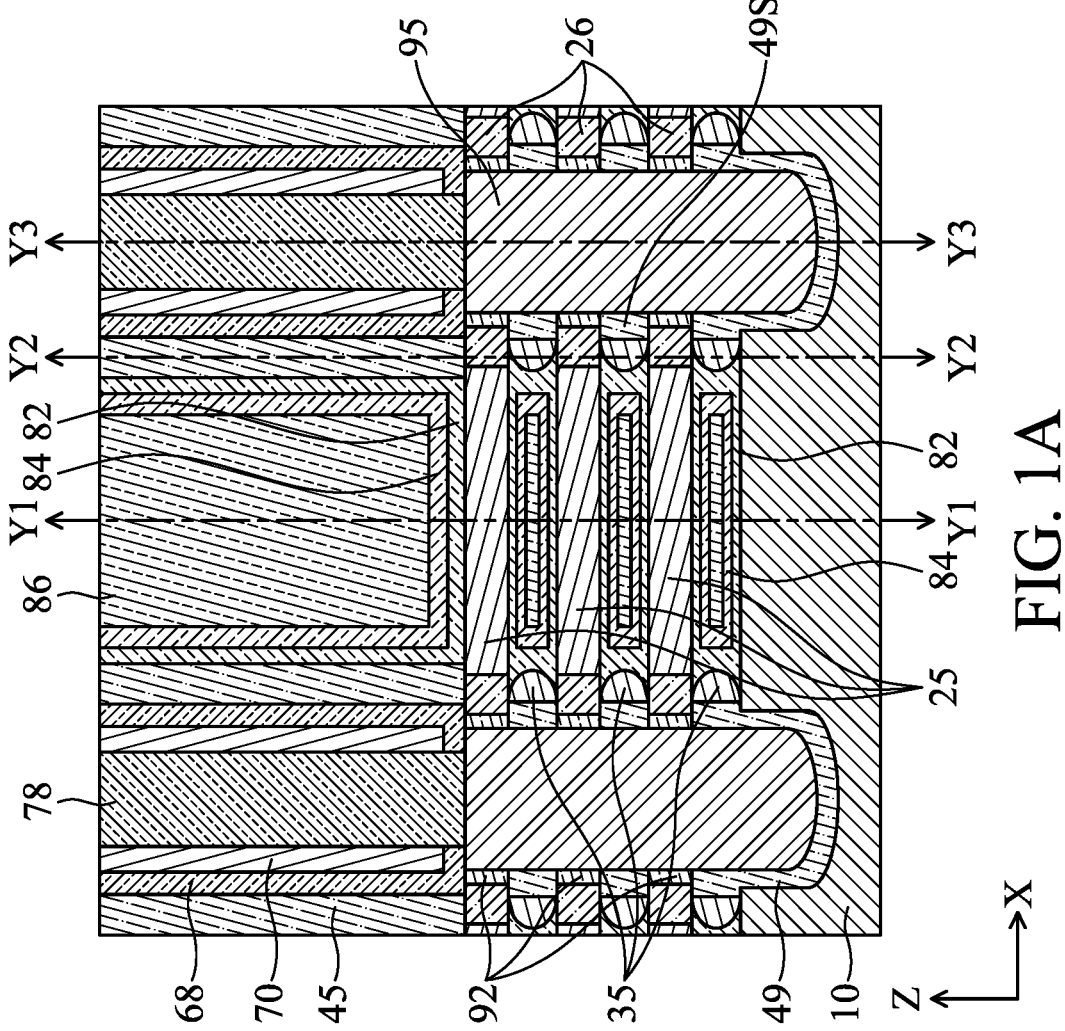
FIGS. 1A-1D show various views of a semiconductor FET device.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

The present disclosure is directed to a nano-scale transistor, such as gate-all-around field effect transistor (GAA FET), using a nanostructure (or nanobody), such as a nanowire or nanosheet as a channel. In particular, the present disclosure is directed to the formation of stressor layers in a source/drain region and removal of the stressor layer, to improve device performance. It is noted that in the present disclosure, a source and a drain are interchangeably used and the structures thereof are substantially the same.

To improve a device performance of a GAA FET, a source/drain (S/D) epitaxial layer having a different lattice constant than the channel semiconductor layer (channel region) is often used to apply appropriate stress to the channel region. Requirements for a process using a source/drain epitaxial layers in nanosheet GAA FETs may include providing sufficient stress to the channel regions; a low resistance of the epitaxial layer and a low contact resistance (e.g., silicide resistance); minimizing an S/D junction capacitance; and minimizing leakage by a mesa device under the channel regions. However, it is generally difficult to achieve these requirements at the same time.

In some embodiments of the present disclosure, a stressor layer is formed in the source/drain region before a metal gate structure is formed, and then the stressor layer is removed after the metal gate structure is formed. The stress applied by the stressor layer to the channel regions is substantially maintained by the metal gate structure.

In some embodiments of the present disclosure, a two-step process to re-engineer source/drain (S/D) including a pre-metal gate formation process and a post-metal gate formation process is provided. The pre-metal gate formation focuses on stress tuning and eliminates the parasitic transistor under the bottommost sheet, resulting in a reduced junction capacitance and a reduced gate-to-S/D coupling capacitance. Further, the post-metal gate formation focuses a low resistance path to channels.

Figures 1B, 1C, 1D:
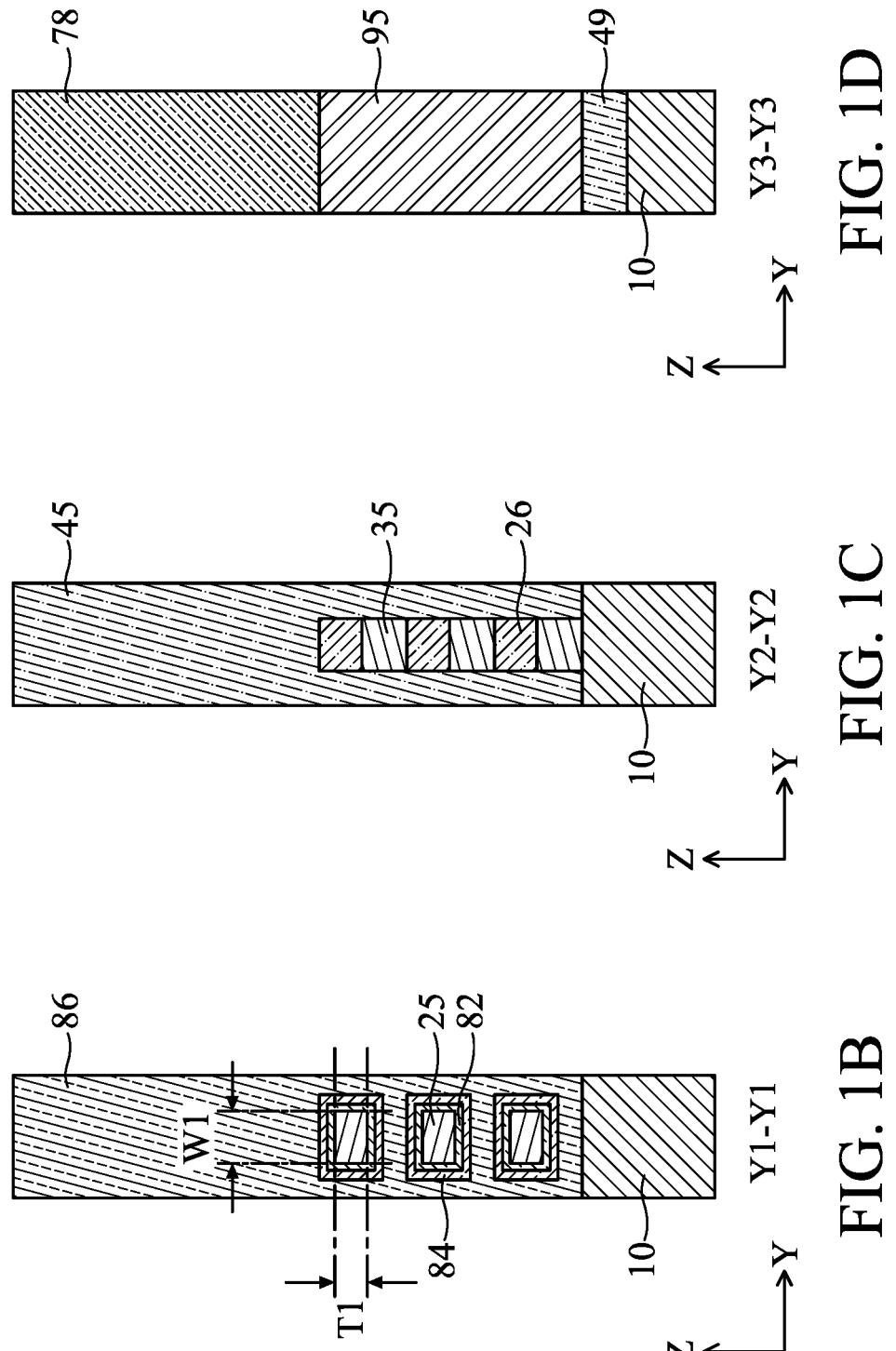

FIGS. 1A-1D show various views of a semiconductor GAA FET device according to an embodiment of the present disclosure. FIG. 1A is a cross sectional view along the X direction (source-drain direction), FIG. 1B is a cross sectional view corresponding to Y1-Y1 of FIG. 1A, FIG. 1C is a cross sectional view corresponding to Y2-Y2 of FIG. 1A and FIG. 1D shows a cross sectional view corresponding to Y3-Y3 of FIG. 1A. In some embodiments, the semiconductor GAA FET device of FIGS. 1A-1D is a p-type FET.

As shown in FIGS. 1A-1C, semiconductor nanostructures 25 are provided over a semiconductor substrate 10, and vertically arranged along the Z direction (the normal direction to the principal surface of the substrate 10). In some embodiments, the substrate 10 includes a single crystalline semiconductor layer on at least its surface portion. The substrate 10 may include a single crystalline semiconductor material such as, but not limited to Si, Ge, SiGe, GaAs, InSb, GaP, GaSb, InAlAs, InGaAs, GaSbP, GaAsSb and InP. In certain embodiments, the substrate 10 is made of crystalline Si.

The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 includes silicon germanium (SiGe) buffer layers epitaxially grown on the silicon substrate 10. The germanium concentration of the SiGe buffer layers may increase from 30 atomic % germanium for the bottom-most buffer layer to 70 atomic % germanium for the top-most buffer layer.

As shown in FIGS. 1A-1C, the semiconductor wires or sheets (collectively nano-structures) 25, which are channel layers, are disposed over the substrate 10. In some embodiments, the semiconductor nanostructures 25 are disposed over a fin structure 11 (see, FIG. 3) protruding from substrate 10 (a bottom fin structure 11). Each of the channel layers 25 is wrapped around by a gate dielectric layer 82, and one or more conductive layers including one or more work function adjustment layers 84 and a gate electrode layer 86. The thickness T1 of the semiconductor nanostructures 25 is in a range from about 5 nm to about 60 nm and the width W1 of the semiconductor nanostructures 25 is in a range from about 5 nm to about 80 nm in some embodiments. In some embodiments, the width of the semiconductor wires or sheets is greater than the thickness. In certain embodiments, the width is up to twice or five times the thickness of the semiconductor nanostructures 25. In some embodiments, the semiconductor nanostructures 25 are made of Si, SiGe or Ge.

In some embodiments, an interfacial dielectric layer is formed between the channel of the semiconductor nanostructure 25 and the gate dielectric layer 82. In some embodiments, the gate dielectric layer 82 includes a high-k dielectric layer. The gate structure includes the gate dielectric layer 82, the gate electrode layer 84 and gate sidewall spacers 45. Although FIGS. 1A-1C show three semiconductor nanostructures 25, the number of the semiconductor nanostructures 25 is not limited to three, and may be as small as one or more than three, and may be up to ten. By adjusting the number of the semiconductor wires, a driving current of the GAA FET device can be adjusted.

Further, in some embodiments, inner spacers 35 are disposed at lateral ends of the gate structures and contact the gate dielectric layer 82, as shown in FIGS. 1A and 1C. The inner spacer 35 includes one or more layers of insulating material, such as silicon oxide, silicon nitride, SiON, SiOC, SiOCN or any other suitable insulating material. In some embodiments, the inner spacer 35 includes two layers made of different material from each other.

In some embodiments, epitaxial extension layers 26 are disposed at both lateral ends of the nanostructure 25. The epitaxial extension layers 26 constitute a lightly doped drain (LDD) structure in some embodiments. The epitaxial extension layers 26 include the same semiconductor material as the semiconductor nanostructures 25 in some embodiments, for example, Si, SiGe or Ge), except for a dopant condition. In some embodiments, the semiconductor nanostructures 25 are made of non-doped semiconductor material and the epitaxial extension layers 26 are made of a doped semiconductor material. In other embodiments, both the semiconductor nanostructures 25 and the epitaxial extension layers 26 are doped, and the dopant concentration of the first extension layer 26 is higher than the dopant concentration of the nanostructures 25 (channel regions). In some embodiments, the dopant concentration of the epitaxial first extension layer 26 gradually increases from the interface between the first extension layer 26 and the nanostructure (channel region). As shown in FIG. 1A, the first extension layer 26 on the end face of one nanostructure 25 is separated from the first extension layer 26 on the end face of an adjacent nanostructure 25.

In some embodiments, a silicide layer 92 is disposed on the lateral end face of the first extension layer 26 as shown in FIG. 1A. In some embodiments, the silicide layer 92 includes WSi, NiSi, TiSi or CoSi or other suitable silicide material or an alloy of a metal element and silicon and/or germanium.

Further, as shown in FIG. 1A, a source/drain (S/D) contact 95 is disposed to contact the silicide layers 92. In some embodiments, the S/D contact 95 includes one or more metal or metallic layers of Ti, TiN, Ta, TaN, Co, W, or an alloy thereof. In some embodiments, the bottom of the metal S/D contact 95 is located below the bottommost one of the nanostructures 25.

In some embodiments, a dielectric layer 49 is disposed between the S/D contact 95 and the bottom fin structure 11 (the substrate 10), as shown in FIGS. 1A and 1D. In some embodiments, part of the dielectric layer is disposed as an additional inner spacer 49S between the inner spacer 35 and the S/D contact 95. In some embodiments, the dielectric layer 49 includes one or more layers of insulating material, such as silicon oxide, silicon nitride, SiON, SiOC, SiOCN or any other suitable insulating materials.

An interlayer dielectric (ILD) layer 70 is disposed over the S/D contact 95 and a conductive contact layer (e.g., plug or bar) 78 passing though the ILD layer 70 is disposed on the S/D contact 95 in some embodiments. The conductive contact layer 95 includes one or more layers of conductive material, such as Ti, TiN, Ta, TaN, Co, W, or an alloy thereof. In some embodiments, the ILD layer 70 includes one or more layers of insulating material, such as silicon oxide, silicon nitride, SiON, SiOC, SiOCN or any other suitable insulating materials. In some embodiments, a contact etch stop layer 68 is disposed between the ILD layer 70 and the gate sidewall spacer 45 and on the S/D contact 95. In some embodiments, the contact etch stop layer 68 includes one or more layers silicon nitride, SiON, SiOC, SiOCN or any other suitable insulating materials.

Figure 1E:
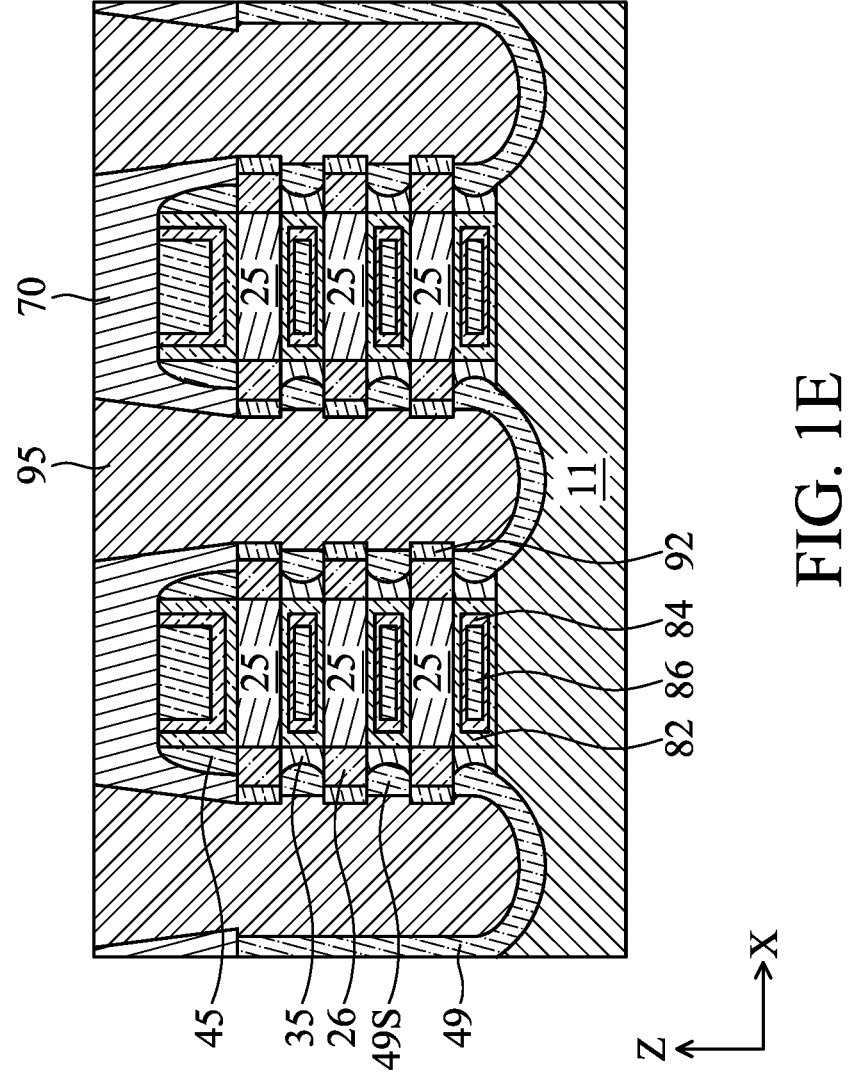
FIG. 1E is a cross sectional view along the source-drain direction of a semiconductor FET device according to an embodiment of the present disclosure.

FIG. 1E is consistent with FIG. 1A, except that two metal gate structures are illustrated in FIG. 1E, forming two GAA FETs, a first GAA FET and a second GAA FET. One of the S/D contact 95 (e.g., drain contact) is shared by the two FETs. In FIG. 1E, the semiconductor nanostructures (wires or sheets) 25 (channel) are connected to metal plug via a doped epitaxial layer formed only on ends of the channels and a silicide layer. In some embodiments, no epitaxial semiconductor layer made of a different semiconductor material (e.g., SiP, SiGe, SiCP, etc.) than the channel layer 25 (e.g., Si) is formed in the source/drain space/recess. In some embodiments, an additional inner spacer 49S made of the same material as the dielectric layer 49 is disposed on the inner spacer 35. Although not shown in FIG. 1E, in some embodiments, the metal gate structure and the source/drain region are repeatedly arranged in the X direction in the desired numbers depending on the design requirements.

FIGS. 2 to 8 show various stages of manufacturing a semiconductor FET device according to an embodiment of the present disclosure. It is understood that additional operations can be provided before, during, and after processes shown by FIGS. 2-8, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1A-1E may be employed in the embodiment of FIGS. 2-8, and detailed explanation thereof may be omitted. Although not shown in FIGS. 2-8, in some embodiments, the gate region and the source/drain region are repeatedly arranged in the X direction in the desired numbers depending on the design requirements (see, FIGS. 1A and 1E).

Figure 2:
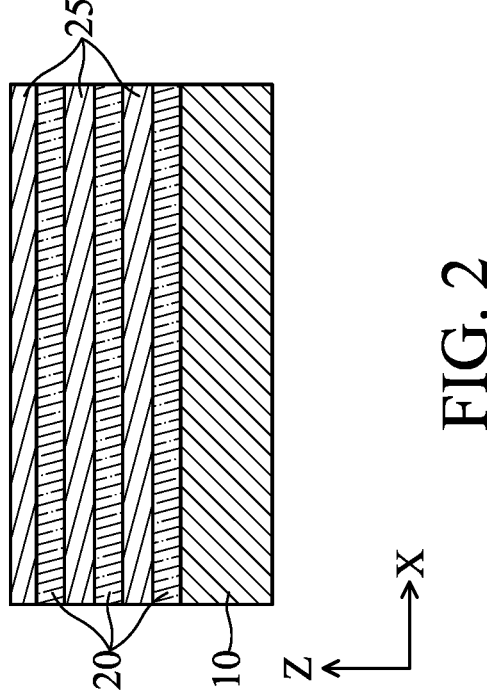

As shown in FIG. 2, first semiconductor layers 20 and second semiconductor layers 25 are alternately formed over the substrate 10. The first semiconductor layers 20 and the second semiconductor layers 25 are made of materials having different lattice constants, and may include one or more layers of Si, Ge, SiGe, GaAs, InSb, GaP, GaSb, InAlAs, InGaAs, GaSbP, GaAsSb or InP.

In some embodiments, the first semiconductor layers 20 and the second semiconductor layers 25 are made of Si, a Si compound, SiGe, Ge or a Ge compound. In some embodiments, the first semiconductor layers 20 is made of Si. In some embodiments, the first semiconductor layers 20 are $Si_{1-x}Ge_x$, where x is equal to or more than about 0.1 and equal to or less than about 0.6, and the second semiconductor layers 25 are Si or $Si_{1-y}Ge_y$, where y is smaller than x and equal to or less than about 0.2. In this disclosure, an "M" compound" or an "M based compound" means the majority of the compound is M.

In other embodiments, the second semiconductor layers 25 are $Si_{1-x}Ge_x$, where x is equal to or more than about 0.1 and equal to or less than about 0.6, and the first semiconductor layers 20 are Si or $Si_{1-y}Ge_y$, where y is smaller than x and equal to or less than about 0.2.

The first semiconductor layers 20 and the second semiconductor layers 25 are epitaxially formed over the substrate 10 alternately. The thickness of the first semiconductor layers 20 may be equal to or greater than that of the second semiconductor layers 25, and is in a range from about 4 nm to about 30 nm in some embodiments, and is in a range from about 5 nm to about 15 nm in other embodiments. The thickness of the second semiconductor layers 25 is in a range from about 4 nm to about 30 nm in some embodiments, and is in a range from about 5 nm to about 15 nm in other embodiments. The thickness of the first semiconductor layers 20 may be the same as, or different from the thickness of the second semiconductor layers 25. Although three first semiconductor layers 20 and three second semiconductor layers 25 are shown in FIG. 2, the numbers are not limited to four, and can be 1, 2 or more than 3, and is less than 20. In some embodiments, the number of the first semiconductor layers 20 is greater by one than the number of the second semiconductor layers 25 (i.e.—the top layer is the first semiconductor layer).

Figure 3:
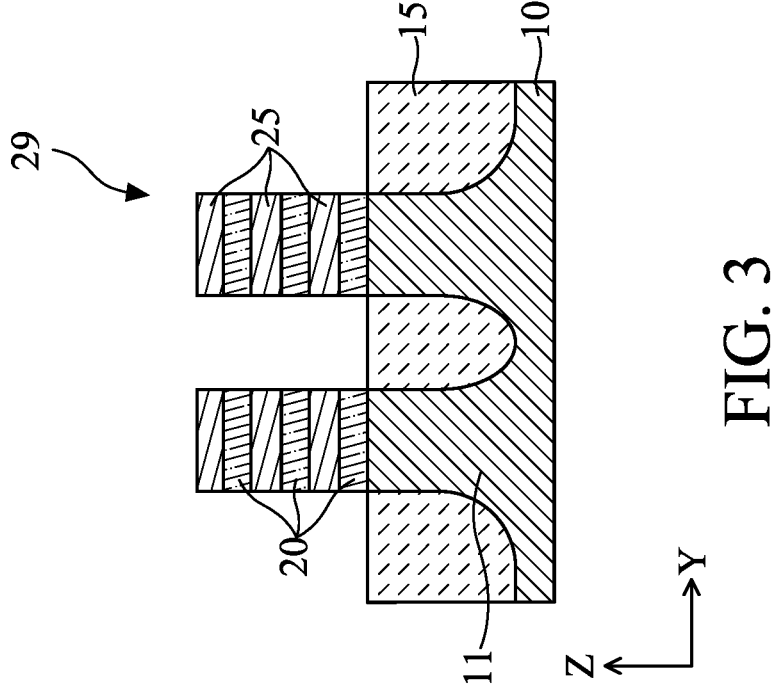
FIGS. 2, 3, 4, 5, 6, 7 and 8 show cross sectional views of the various stages of manufacturing a semiconductor GAA FET device according to an embodiment of the present disclosure.

After the stacked semiconductor layers are formed, fin structures are formed by using one or more lithography and etching operations, as shown in FIG. 3. The fin structures may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

As shown in FIG. 3, the fin structures 29 extend in the X direction and are arranged in the Y direction. The number of the fin structures is not limited to two as shown in FIG. 3, and may be as small as one and three or more. In some embodiments, one or more dummy fin structures are formed on both sides of the fin structures 29 to improve pattern fidelity in the patterning operations. As shown in FIG. 3, the fin structures 29 have upper portions constituted by the stacked semiconductor layers 20, 25 and well portions 11 (a mesa structure).

The width of the upper portion of the fin structure 29 along the Y direction is in a range from about 5 nm to about 80 nm in some embodiments, and is in a range from about 10 nm to about 40 nm in other embodiments.

After the fin structures 29 are formed, an insulating material layer including one or more layers of insulating material is formed over the substrate so that the fin structures are fully embedded in the insulating layer. The insulating material for the insulating layer may include silicon oxide, silicon nitride, silicon oxynitride (SiON), SiOCN, SiCN, fluorine-doped silicate glass (FSG), or a low-k dielectric material, formed by LPCVD (low pressure chemical vapor deposition), plasma-enhanced CVD (PECVD) or flowable CVD. An anneal operation may be performed after the formation of the insulating layer. Then, a planarization operation, such as a chemical mechanical polishing (CMP) method and/or an etch-back method, is performed such that the upper surface of the uppermost second semiconductor layer 25 is exposed from the insulating material layer. In some embodiments, one or more fin liner layers are formed over the fin structures before forming the insulating material layer. In some embodiments, the fin liner layers include a first fin liner layer formed over the substrate 10 and sidewalls of the bottom part of the fin structures 11, and a second fin liner layer formed on the first fin liner layer. The fin liner layers are made of silicon nitride or a silicon nitride-based material (e.g., SiON, SiCN or SiOCN). The fin liner layers may be deposited through one or more processes such as physical vapor deposition (PVD), chemical vapor deposition (CVD), or atomic layer deposition (ALD), although any acceptable process may be utilized.

Then, as shown in FIG. 3, the insulating material layer is recessed to form an isolation insulating layer 15 so that the upper portions of the fin structures 29 are exposed. With this operation, the fin structures 29 are separated from each other by the isolation insulating layer 15, which is also called a shallow trench isolation (STI). The isolation insulating layer 15 may be made of suitable dielectric materials such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the isolation insulating layer 15 is formed through a process such as CVD, flowable CVD (FCVD), or a spin-on-glass process, although any acceptable process may be utilized.

In some embodiments, the insulating material layer 15 is recessed until the upper portion of the fin structure (well layer) 11 is exposed. In other embodiments, the upper portion of the fin structure 11 is not exposed. The first semiconductor layers 20 are sacrificial layers which are subsequently partially removed, and the second semiconductor layers 25 are subsequently formed into semiconductor wires or sheets as channel layers of a GAA FET. In other embodiments, the second semiconductor layers 25 are sacrificial layers which are subsequently partially removed, and the first semiconductor layers 20 are subsequently formed into semiconductor wires or sheets as channel layers.

Figure 4:
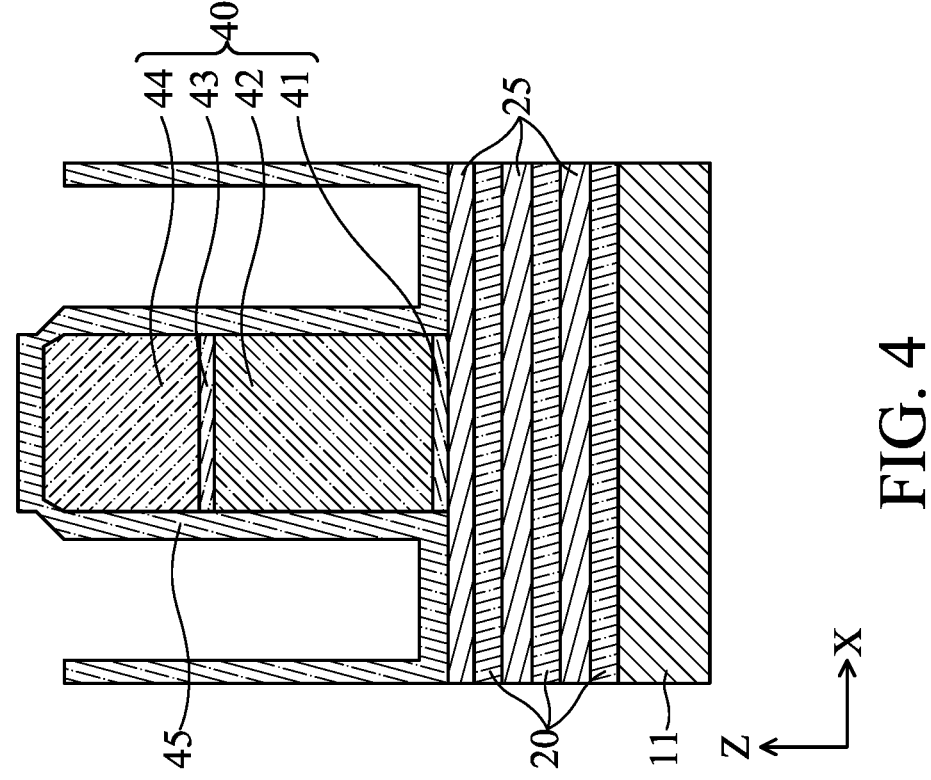

After the isolation insulating layer 15 is formed, a sacrificial (dummy) gate structure 40 is formed, as shown in FIG. 4. FIG. 4 illustrates a structure after a sacrificial gate structure 40 is formed over the exposed fin structures 29. The sacrificial gate structure 40 is formed over a portion of the fin structures which is to be a channel region. The sacrificial gate structure 40 defines the channel region of the GAA FET. The sacrificial gate structure 40 includes a sacrificial gate dielectric layer 41 and a sacrificial gate electrode layer 42. The sacrificial gate dielectric layer 41 includes one or more layers of insulating material, such as a silicon oxide-based material. In one embodiment, silicon oxide formed by CVD is used. The thickness of the sacrificial gate dielectric layer 41 is in a range from about 1 nm to about 5 nm in some embodiments.

The sacrificial gate structure 40 is formed by first blanket depositing the sacrificial gate dielectric layer 41 over the fin structures. A sacrificial gate electrode layer is then blanket deposited on the sacrificial gate dielectric layer and over the fin structures, such that the fin structures are fully embedded in the sacrificial gate electrode layer. The sacrificial gate electrode layer includes silicon such as polycrystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. Subsequently, a mask layer is formed over the sacrificial gate electrode layer. The mask layer includes a pad silicon nitride layer 43 and a silicon oxide mask layer 44.

Next, a patterning operation is performed on the mask layer and sacrificial gate electrode layer is patterned into the sacrificial gate structure 40, as shown in FIG. 4. The sacrificial gate structure includes the sacrificial gate dielectric layer 41, the sacrificial gate electrode layer 42 (e.g., poly silicon), the pad silicon nitride layer 43 and the silicon oxide mask layer 44. By patterning the sacrificial gate structure, the stacked layers of the first and second semiconductor layers are partially exposed on opposite sides of the sacrificial gate structure, thereby defining source/drain regions, as shown in FIG. 4. In this disclosure, a source and a drain are interchangeably used and the structures thereof are substantially the same. In some embodiments, one sacrificial gate structure is formed over one or more fin structures, but the number of the sacrificial gate structures per fin structure is not limited to one. Two or more sacrificial gate structures are arranged in the X direction in some embodiments. In certain embodiments, one or more dummy sacrificial gate structures are formed on both sides of the sacrificial gate structures to improve pattern fidelity.

Further, a first cover layer 45 for gate sidewall spacers is formed over the sacrificial gate structure 40, as shown in FIG. 4. The first cover layer 45 is deposited in a conformal manner so that it is formed to have substantially equal thicknesses on vertical surfaces, such as the sidewalls, horizontal surfaces, and the top of the sacrificial gate structure, respectively. In some embodiments, the first cover layer 45 has a thickness in a range from about 5 nm to about 20 nm. The first cover layer 45 includes one or more of silicon nitride, SiON, SiCN, SiCO, SiOCN or any other suitable dielectric material. The cover layer 45 can be formed by ALD or CVD, or any other suitable method.

Figures 5, 6:
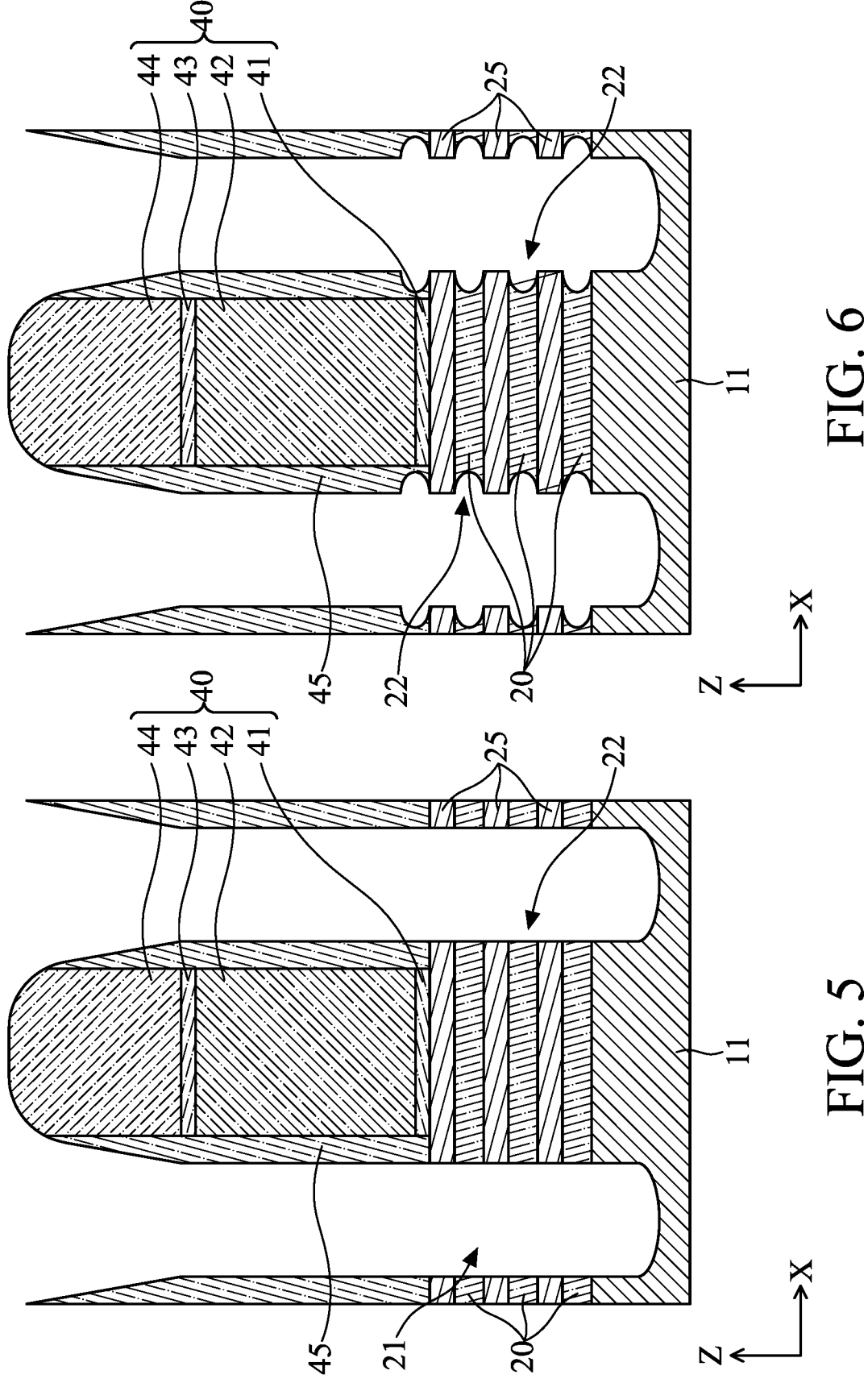

Next, as shown in FIG. 5, the first cover layer 45 is anisotropicaly etched to remove the first cover layer 45 disposed on the source/drain region, while leaving the first cover layer 45 as sidewall spacers on side faces of the sacrificial gate structure 40. FIG. 5 shows a cross sectional view along the X direction. Then the stacked structure of the first semiconductor layers 20 and the second semiconductor layer 25 is etched down at the source/drain region, by using one or more lithography and etching operations, thereby forming a source/drain space 21. In some embodiments, the substrate 10 (or the bottom part of the fin structures 11) is also partially etched to form a mesa structure. In some embodiments, an n-type FET and a p-type FET are manufactured separately, and in such a case, a region for one type of FET is processed, and a region for the other type of FET is covered by a protective layer, such as a silicon nitride. In some embodiments, as shown in FIG. 5, the recessed fin structure has a U-shape. In other embodiments, the recessed fin structure has a V-shape showing (111) facets of silicon crystal. In other embodiments, the recess has a reverse trapezoid shape, or a rectangular shape.

In some embodiments, the recess is formed by a dry etching process, which may be anisotropic. The anisotropic etching process may be performed using a process gas mixture including $BF_2$, $Cl_2$, $CH_3F$, $CH_4$, HBr, $O_2$, Ar, other etchant gases. Process gases may be activated into a plasma by any suitable method of generating the plasma, such as transformer coupled plasma (TCP) systems, inductively coupled plasma (ICP) systems, magnetically enhanced reactive ion techniques. The plasma is a remote plasma that is generated in a separate plasma generation chamber connected to the processing chamber in some embodiments. The process gases used in the plasma etching process includes etchant gases such as $H_2$, Ar, other gases, or a combination of gases. In some embodiments, carrier gases, such as $N_2$, Ar, He, Xe, are combined with the a plasma etching process gas using hydrogen (H) radicals. The H radicals may be formed by flowing $H_2$ gas into a plasma generation chamber and igniting a plasma within the plasma generation chamber. In some embodiments, an additional gas may be ignited into a plasma within the plasma generation chamber, such as Ar. The H radicals may selectively etch (100) planes over (111) planes or (110) planes. In some cases, the etch rate of the (100) planes is be about three times greater than the etch rate of (111) planes. Due to this selectivity, the etching by the H radicals may tend to slow or stop along (111) planes or (110) planes of silicon during the second patterning process.

Further, as shown in FIG. 6, the first semiconductor layers 20 are laterally etched in the X direction within the source/drain space 21, thereby forming cavities 22. When the first semiconductor layers 20 are SiGe and the second semiconductor layers 25 are Si, the first semiconductor layers 20 can be selectively etched by using a wet etchant such as, but not limited to, a mixed solution of $H_2O_2$, $CH_3COOH$ and HF, followed by $H_2O$ cleaning. In some embodiments, the etching by the mixed solution and cleaning by water is repeated 10 to 20 times. The etching time by the mixed solution is in a range from about 1 min to about 2 min in some embodiments. The mixed solution is used at a temperature in a range from about 60° C. to about 90° C. in some embodiments. In some embodiments, other etchants are used.

In some embodiments, the cavity 22 has a curved end shape convex toward the first semiconductor layer 20 (lateral U-shape cross section). In other embodiments, the cavity 22 has a lateral V-shape cross section having apex at the first semiconductor layer 20.

Figures 7, 8:
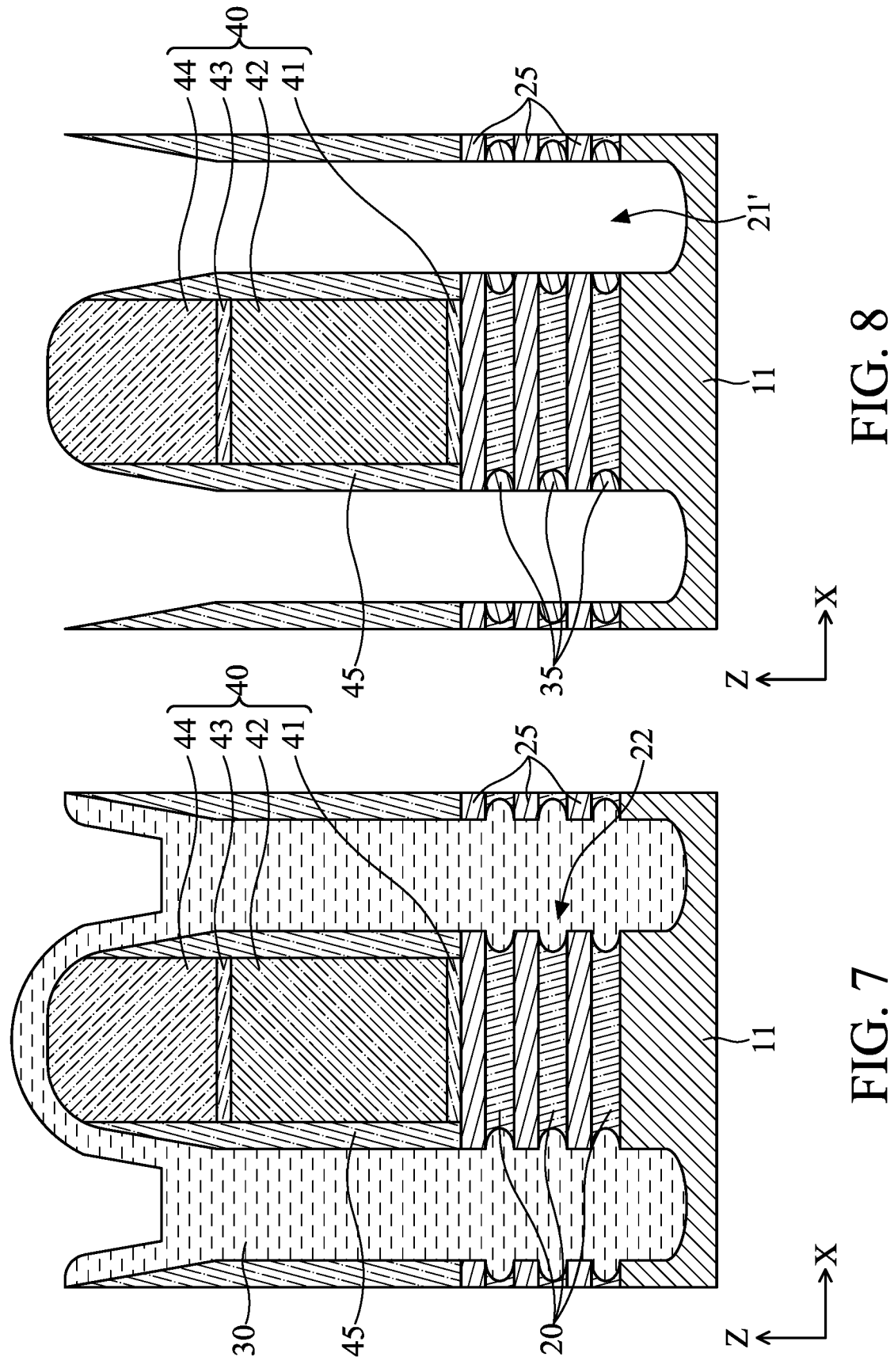

Next, as shown in FIG. 7, a first insulating layer 30 is formed on the etched lateral ends of the first semiconductor layers 20 and on end faces of the second semiconductor layers 25 in the source/drain space 21 and over the sacrificial gate structure 40. In some embodiments, the first insulating layer 30 fills the source/drain space 21 as shown in FIG. 7, and in other embodiments, the first insulating layer 30 is conformally formed so that a space is left in the source/drain space 21. The first insulating layer 30 includes one of silicon nitride and silicon oxide, SiON, SiOC, SiCN and SiOCN, or any other suitable dielectric material. The first insulating layer 30 is made of a different material than the sidewall spacers (first cover layer) 45 in some embodiments, and is made of the same material as the sidewall spacers 45 in other embodiments. The first insulating layer 30 can be formed by ALD or any other suitable methods. By forming the first insulating layer 30, the cavities 22 are fully filled with the first insulating layer 30.

After the first insulating layer 30 is formed, an etching operation is performed to partially remove the first insulating layer 30, thereby forming inner spacers 35, as shown in FIG. 8. In some embodiments, the end face of the inner spacers 35 is recessed more than the end face of the second semiconductor layers 25. The recessed amount is in a range from about 0.2 nm to about 3 nm and is in a range from about 0.5 nm to about 2 nm in other embodiments. In other embodiments, the recessed amount is less than 0.5 nm and may be equal to zero (i.e.—the end face of the inner spacer 35 and the end face of the second semiconductor layers 25 are flush with each other).

In some embodiments, before forming the first insulating layer 30, an additional insulating layer having a smaller thickness than the first insulating layer 30 is formed, and thus the inner spacers 35 have a two-layer structure. In some embodiments, widths (lateral length) of the inner spacers 35 are not constant.

FIGS. 9-22 show various stages of manufacturing a semiconductor FET device according to an embodiment of the present disclosure. It is understood that additional operations can be provided before, during, and after processes shown by FIGS. 9-22, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1A-1E and 2-8 may be employed in the embodiment of FIGS. 9-22, and detailed explanation thereof may be omitted. Although not shown in FIGS. 9-22, in some embodiments, the gate region and the source/drain region are repeatedly arranged in the X direction in the desired numbers depending on the design requirements (see, FIGS. 1A and 1E).

Figures 9, 10:
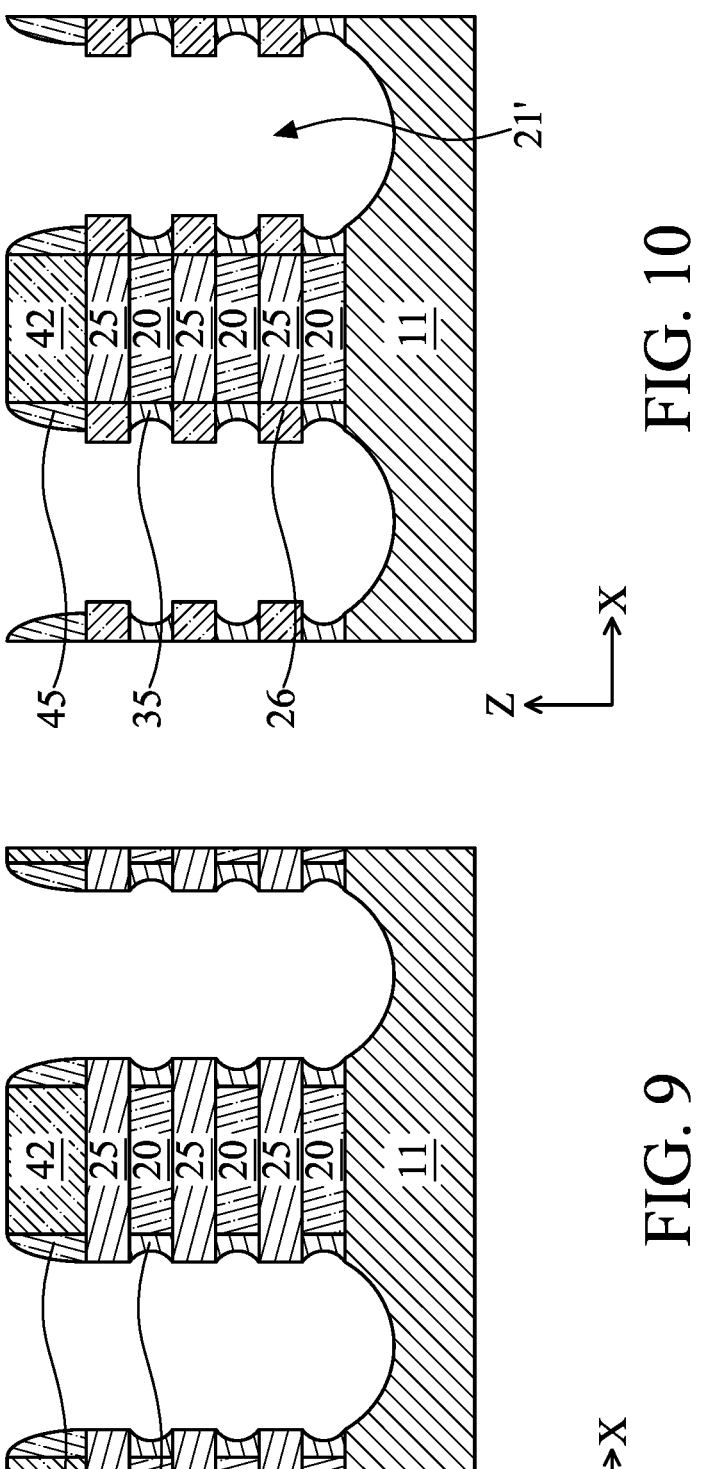
FIGS. 9, 10, 11, 12, 13, 14, 15, 16, 17, 18, 19, 20, 21 and 22 show cross sectional views of the various stages of manufacturing a semiconductor GAA FET device according to an embodiment of the present disclosure.

FIG. 9 is consistent with FIG. 8 except that some of the features are omitted for simplicity. After the inner spacers 35 are formed, an epitaxial first extension layer 26 is formed on lateral end faces of the second semiconductor layer 25 in some embodiments, as shown in FIG. 10. In some embodiments, the first extension layer 26 includes Si doped with P or As for an n-type FET and B for a p-type FET. In some embodiments, the dopant concentration of the first extension layer 26 is higher than the dopant concentration of the second semiconductor layers 25. In some embodiments, the dopant concentration of the epitaxial first extension layer 26 gradually increases from the interface between the first extension layer 26 and the second semiconductor layers 25 to the source/drain space 21. In some embodiments, the thickness of the first extension layer 26 as deposited is in a range from about 1 nm to about 10 nm. In some embodiments, during the epitaxial formation of the first extension layer 26, some of the dopant elements diffuse into the second semiconductor layer 25 to a depth of about 0.5 nm to about 2 nm.

Figures 11, 12:
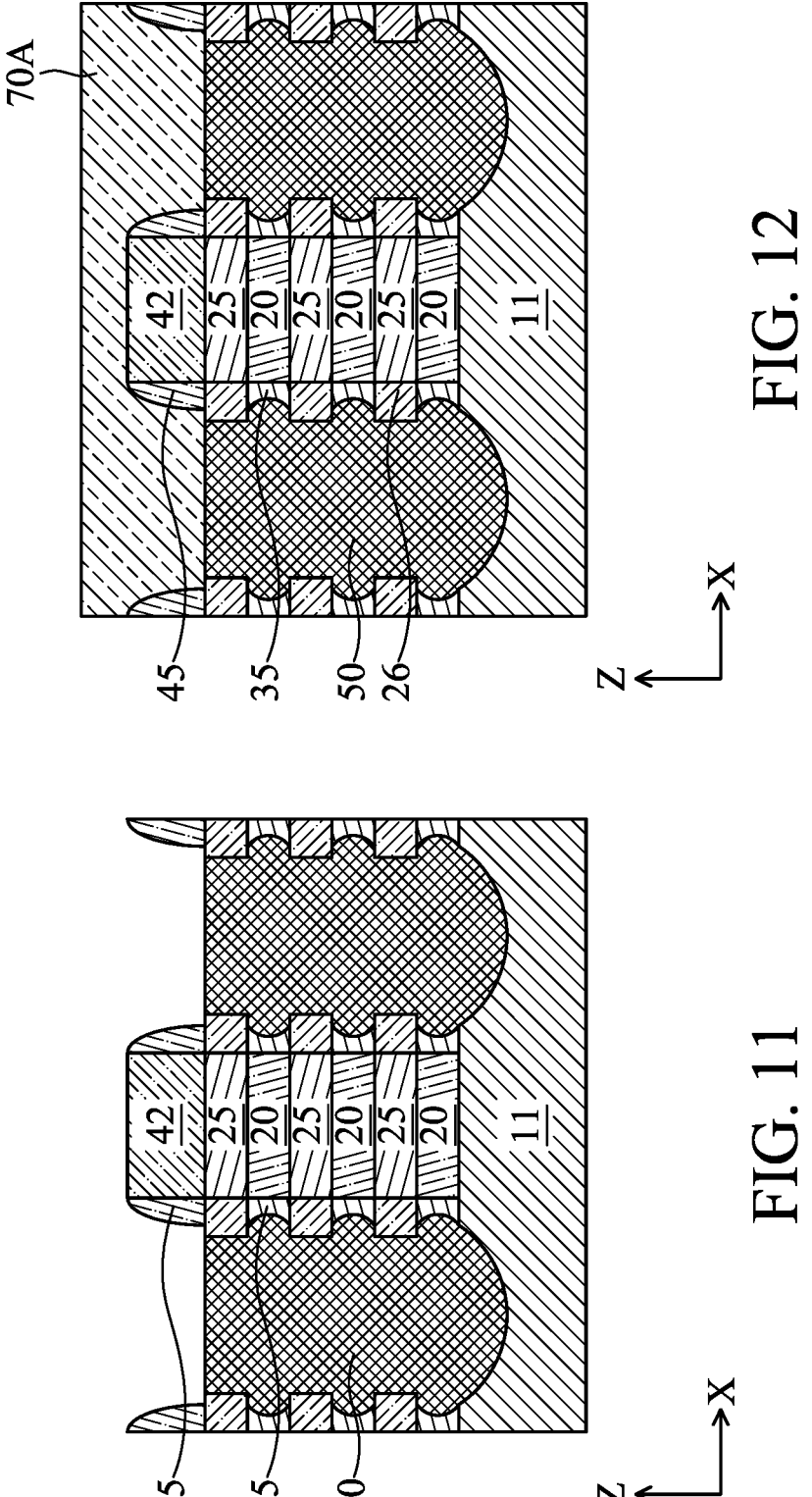

Then, as shown in FIG. 11, an epitaxial stressor layer 50 is formed in the source/drain space 21. In some embodiments, the epitaxial stressor layer 50 include one or more layers of SiC, SiP, SiAs and/or SiCP for an n-type FET. In certain embodiments, SiC or SiCP is used. In some embodiments, the epitaxial stressor layer 50 includes SiGe, SiGeSn Ge, GeSn and/or SiSn for a p-type FET. When SiGe is used, the Ge content is about 60 atomic % to about 80 atomic % in some embodiments. The epitaxial stressor layer 50 applies a tensile stress to the second semiconductor layer 25 for an n-type FET and a compressive stress to the p-type FET.

Then, a dielectric layer 70A is formed over the epitaxial stressor layer 50 and the dummy gate structure as shown in FIG. 12. In some embodiments, before the dielectric layer 70A is formed, a contact etch stop layer (see, layer 68 shown in FIG. 1A) is formed.

Next, the dielectric layer 70A is planarized by CMP to expose the dummy gate electrode layer 42, and then the dummy gate electrode layer 42 and the sacrificial gate dielectric layer 41 are removed. The dielectric layer 70A protects the epitaxial stressor layers 50 during the removal of the sacrificial gate structures. The sacrificial gate structures can be removed using plasma dry etching and/or wet etching. When the sacrificial gate electrode layer 42 is polysilicon and the dielectric layer 70A is silicon oxide, a wet etchant such as a TMAH solution can be used to selectively remove the sacrificial gate electrode layer 42. The sacrificial gate dielectric layer 41 is thereafter removed using plasma dry etching and/or wet etching. The materials for the dielectric layer 70A include compounds comprising Si, O, C and/or H, such as silicon oxide, SiCOH and SiOC. Organic materials, such as polymers, may be used for the dielectric layer 70A.

Figures 13, 14:
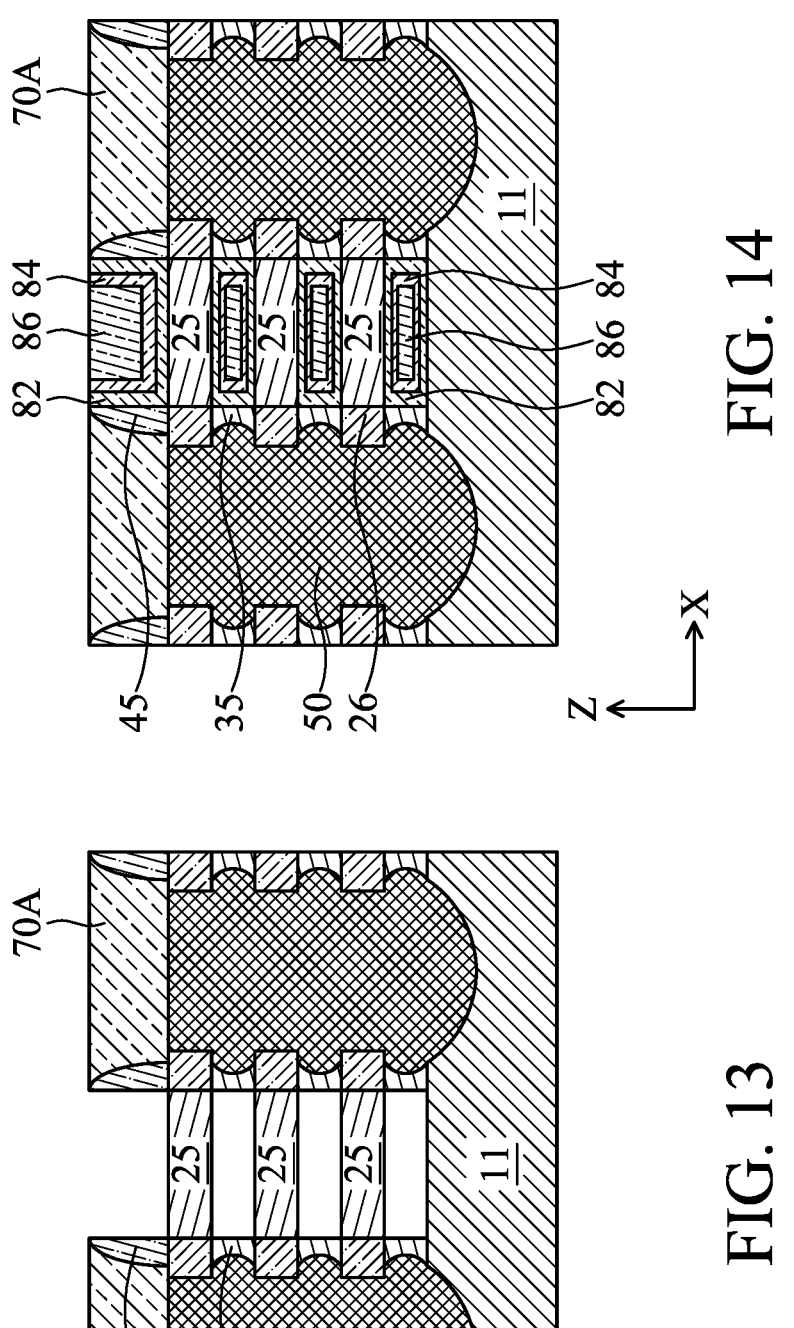

After the sacrificial gate structures are removed, the first semiconductor layers 20 are removed, thereby forming wires or sheets (channel regions) of the second semiconductor layers 25 as shown in FIG. 13. The first semiconductor layers 20 can be removed or etched using an etchant that can selectively etch the first semiconductor layers 20 against the second semiconductor layers 25, as set forth above. Since the first insulating layers (inner spacers) 35 are formed, the etching of the first semiconductor layers 20 stops at the first insulating layer 35. In other words, the first insulating layer 35 functions as an etch-stop layer for etching of the first semiconductor layers 20.

After the semiconductor wires or sheets (channel regions) of the second semiconductor layers 25 are formed, a metal gate structure is formed as shown in FIG. 14. In some embodiments, the structure and/or material of the gate electrode for the n-type GAA FET are different from the structure and/or material of the gate electrode for the p-type GAA FET.

In certain embodiments, the gate dielectric layer 82 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 82 includes an interfacial layer (not shown) formed between the channel layers and the dielectric material.

The gate dielectric layer 82 may be formed by CVD, ALD or any suitable method. In one embodiment, the gate dielectric layer is formed using a highly conformal deposition process such as ALD in order to ensure the formation of a gate dielectric layer having a uniform thickness around each channel layer. The thickness of the gate dielectric layer 82 is in a range from about 1 nm to about 6 nm in one embodiment.

In some embodiments, the metal gate structure includes one or more work function adjustment layers 84 disposed over the gate dielectric layer 82. The work function adjustment layers 84 are made of a conductive material such as a single layer of TiN, TaN, TaAlC, TiC, TaC, Co, Al, TiAl, HfTi, TiSi, TaSi or TiAlC, or a multilayer of two or more of these materials. In some embodiments, one or more of TiAlC, Al, TiAl, TaN, TaAlC, TiN, TiC and Co are used as the work function adjustment layer for the p-channel FET. For an n-channel FET, one or more of TaN, TaAlC, TiN, TiC, Co, TiAl, HfTi, TiSi and TaSi is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

The gate electrode layer 86 is formed on the work function adjustment layer 84 to surround each channel layer. The gate electrode layer 86 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 86 may be formed by CVD, ALD, electro-plating, or other suitable method. The gate electrode layer is also deposited over the upper surface of the dielectric layer 70A. The gate dielectric layer and the gate electrode layer formed over the dielectric layer 70A are then planarized by using, for example, CMP, until the top surface of the dielectric layer 70A is revealed. In some embodiments, after the planarization operation, the gate electrode layer is recessed and a cap insulating layer (not shown) is formed over the recessed gate electrode. The cap insulating layer includes one or more layers of a silicon nitride-based material, such as silicon nitride. The cap insulating layer is formed by depositing an insulating material followed by a planarization operation.

By forming the metal gate structure around the second semiconductor layers 25, the stress imposed by the epitaxial stressor layer 50 is held and maintained by the metal gate structure.

Figures 15, 16:
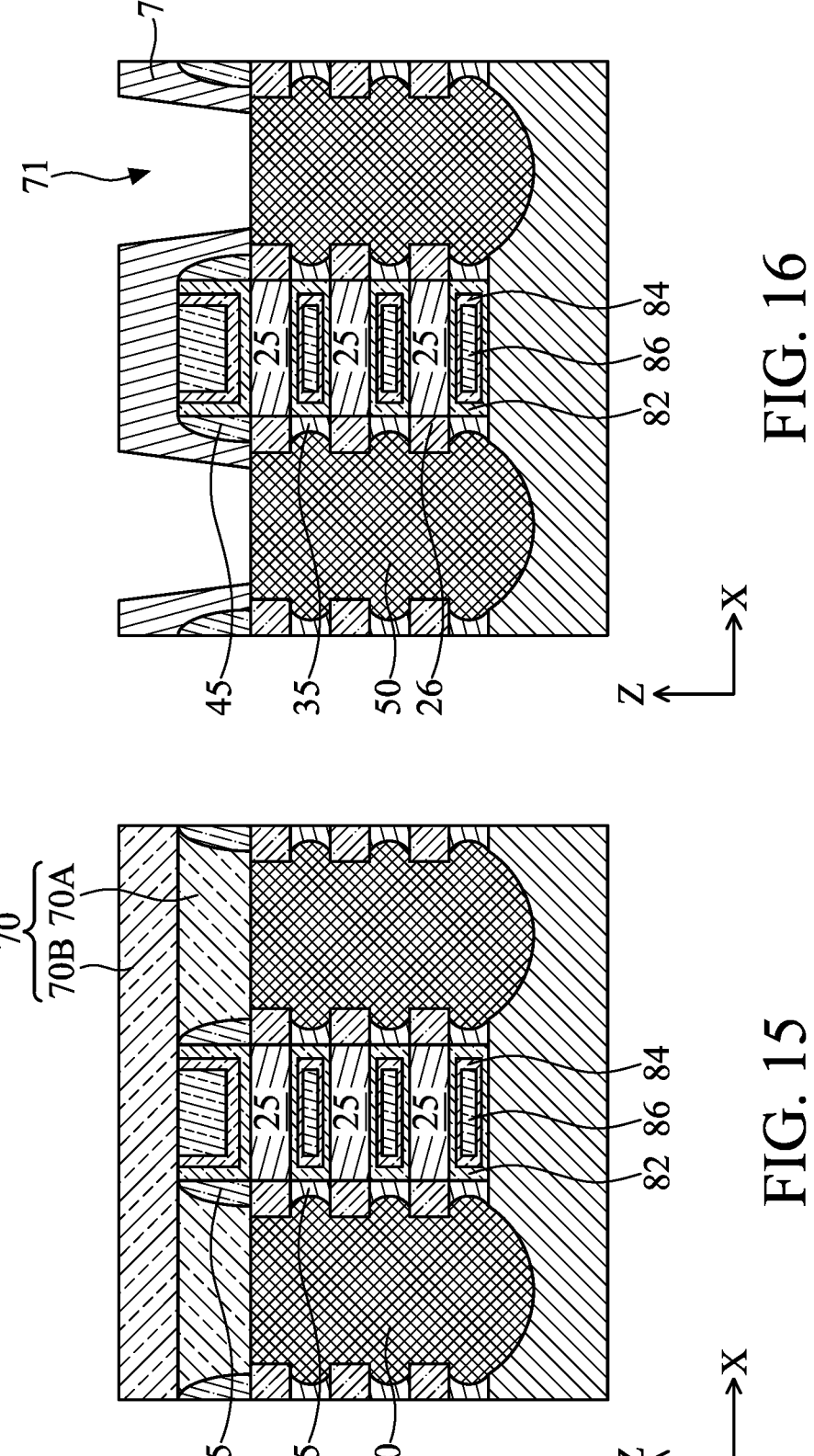

Subsequently, an additional dielectric layer 70B is formed over the dielectric layer 70A and the metal gate structure as shown in FIG. 15. The materials for the additional dielectric layer 70B include compounds comprising Si, O, C and/or H, such as silicon oxide, SiCOH and SiOC. Organic materials, such as polymers, may be used for the dielectric layer 70B. In some embodiments, the materials of the dielectric layers 70A and 70B are the same. After FIG. 15, the combination of the dielectric layers 70A and 70B is referred to as an ILD layer 70.

Then, an opening 71 is formed in the ILD layer 70 by using one or more lithography and etching operations to expose an upper surface of the epitaxial stressor layer, as shown in FIG. 16.

Figures 17, 18:
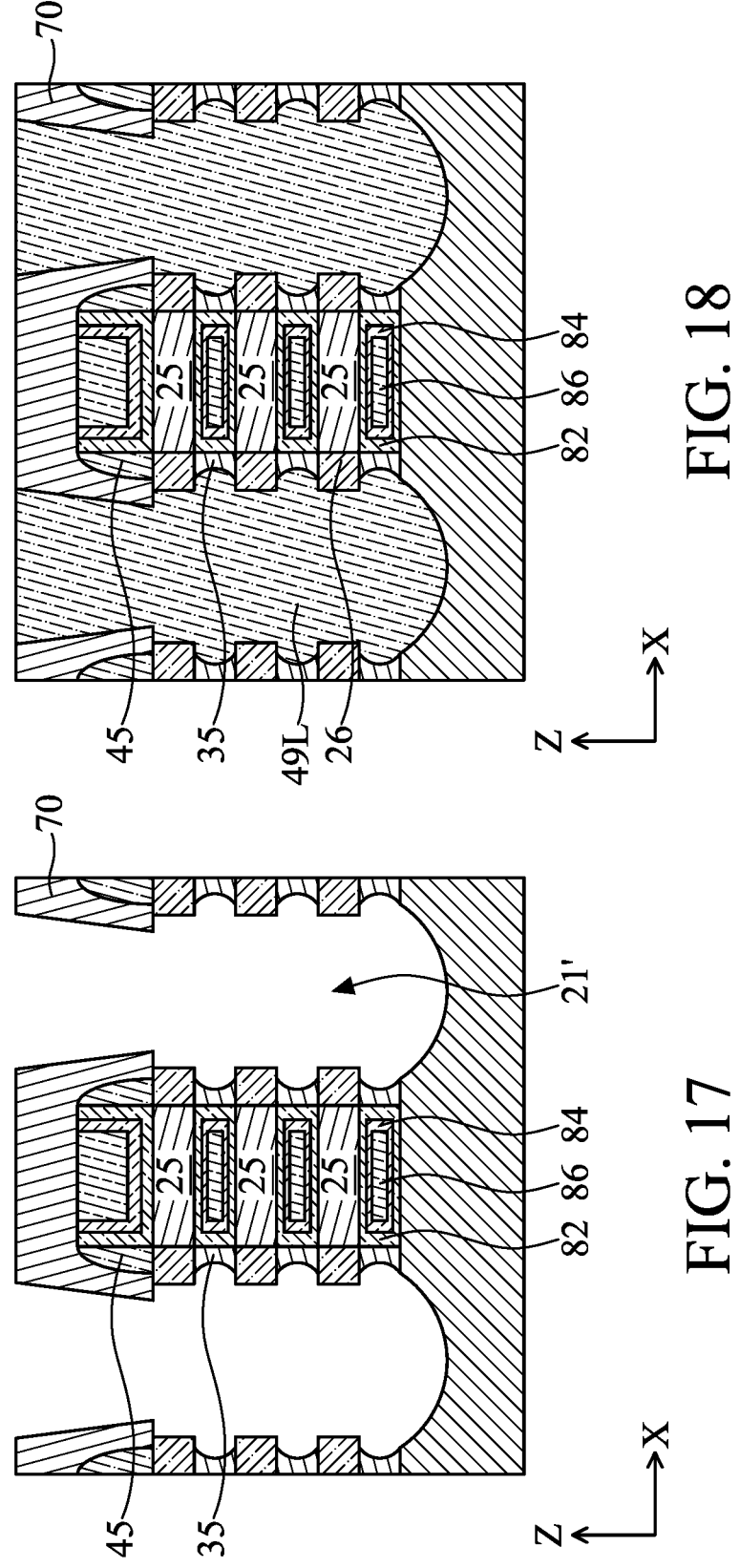

Next, the stressor layer 50 is selectively removed through the opening 71, thereby reforming a source/drain space 21', as shown in FIG. 17. Since the composition of the epitaxial semiconductor stressor layer 50 is sufficiently different from the composition of the extension semiconductor layer 26 and the substrate 10, the stressor layer 50 can be removed by dry and/or wet etching selective to the first extension layer 26 and the substrate 10. As set forth above, even after the stressor layer 50 is removed, the stress imposed by the epitaxial stressor layer 50 is held and maintained by the metal gate structure.

Further, as shown in FIG. 18, a dielectric layer 49L is formed to fill the source/drain space 21'. In some embodiments, the dielectric layer 49L includes one or more layers of silicon nitride, SiON, SiCN, SiCO, SiOCN or any other suitable dielectric material. The dielectric layer 49L can be formed by ALD or CVD, or any other suitable method.

Figures 19, 20:
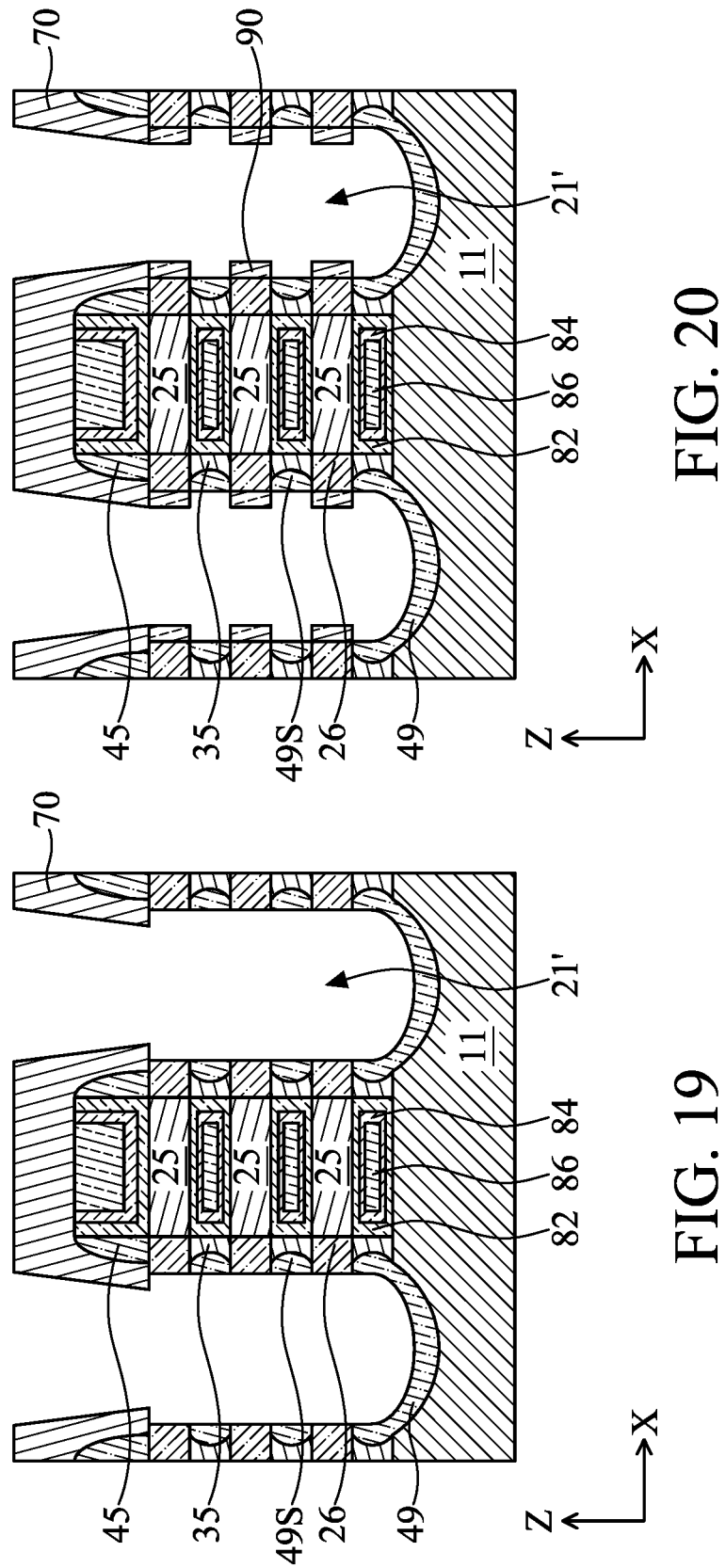

Then, the dielectric layer 49L is partially removed by one or more of isotropic and anisotropic etching, thereby forming the dielectric layer 49, as shown in FIG. 19. The remaining thickness of the dielectric layer 49 is in a range from about 2 nm to about 20 nm in some embodiments at the bottom of the source/drain space 21'. The dielectric layer 49 suppress a leak current between the source and the drain through the mesa structure 11. As shown in FIG. 19, part of the dielectric layer 49 remains on the inner spacer 35 as an additional inner spacer 49S.

After the dielectric layer 49 is formed, a second extension semiconductor layer 90 is formed on the first extension layer 26 as shown in FIG. 20. In some embodiments, the second extension layer 90 includes doped Si. The second extension semiconductor layer 90 is selectively formed on the first extension layer 26 in a self-aligning manner.

In some embodiments, the second extension layer 90 includes Si doped with P or As for an n-type FET and B for a p-type FET. In some embodiments, the thickness of the second extension layer 90 as deposited is in a range from about 1 nm to about 10 nm. In some embodiments, the second extension layer 90 is formed by ALD or CVD at a temperature about 250° C. to 350° C., which is lower than the formation temperatures of the first extension layer 26 and the stressor layer 50.

Figures 21, 22:
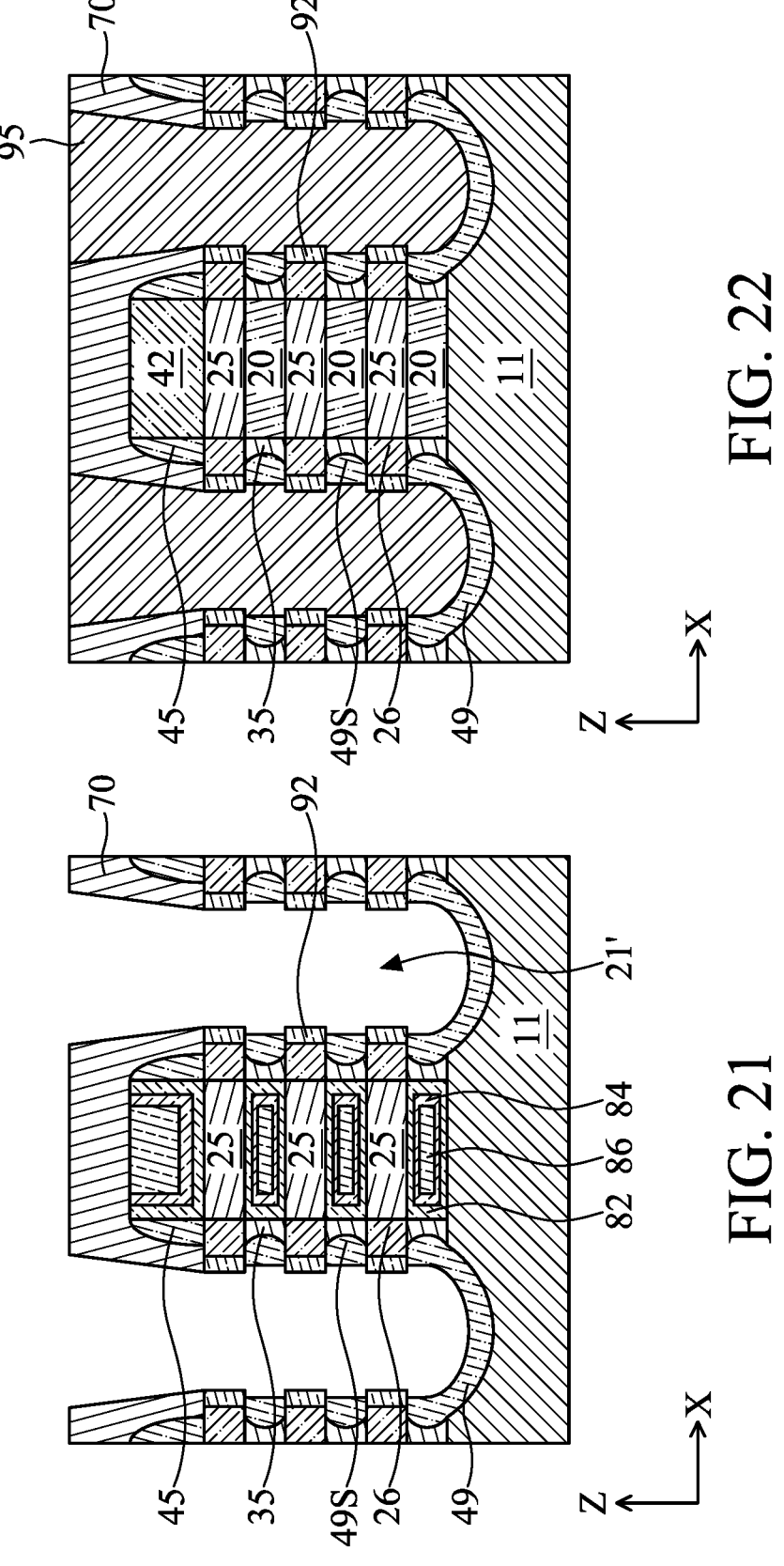

Then, an alloy layer (e.g., silicide layer) 92 is formed on the second extension layer 90, as shown in FIG. 21. In some embodiments, a metal layer is formed on the second extension layer 90 and a thermal operation is performed to react the metal material and the semiconductor material of the second extension layer 90 to form the alloy layer 92. Thus, all of or a part of the second extension layer 90 is consumed into the alloy layer 92. In some embodiments, the silicide layer 92 includes one or more of WSi, CoSi, NiSi, TiSi, MoSi and TaSi.

Further, one or more conductive layers are formed in the source/drain space 21' to form a source/drain (S/D) contact 95 as shown in FIG. 22. In some embodiments, the S/D contact 95 includes one or more layers of Co, Ni, W, Ti, Ta, Cu, Al, TiN and TaN.

It is understood that the GAA FETs undergo further CMOS processes to form various features such as contacts/vias, interconnect metal layers, dielectric layers, passivation layers, etc.

FIGS. 23-32 show various stages of manufacturing a semiconductor FET device according to an embodiment of the present disclosure. It is understood that additional operations can be provided before, during, and after processes shown by FIGS. 23-32, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1A-1E, 2-8 and 9-22 may be employed in the embodiment of FIGS. 23-32, and detailed explanation thereof may be omitted. Although not shown in FIGS. 22-32, in some embodiments, the gate region and the source/drain region are repeatedly arranged in the X direction in the desired numbers depending on the design requirements (see, FIGS. 1A and 1E).

Figures 23, 24:
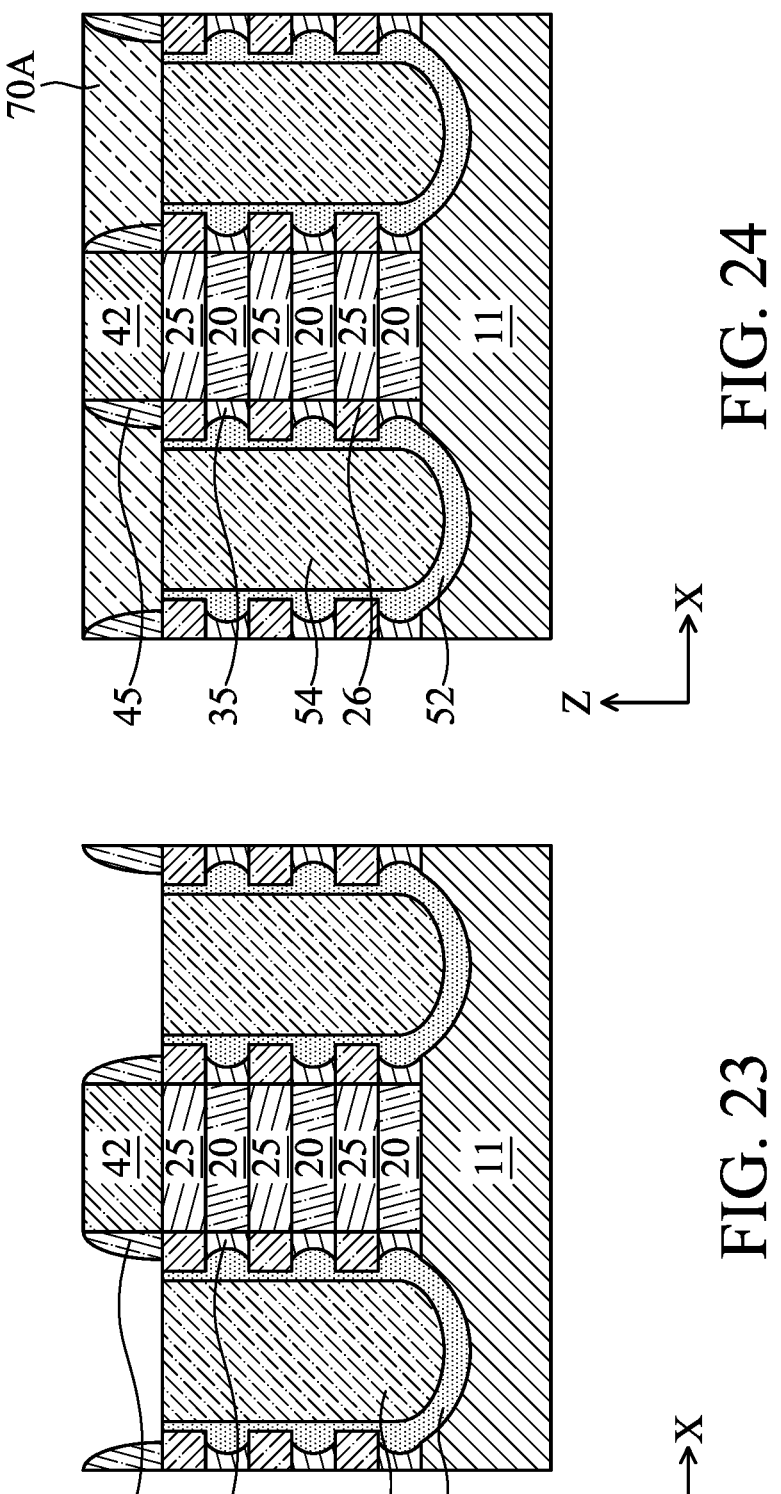
FIGS. 23, 24, 25, 26, 27, 28, 29, 30, 31 and 32 show cross sectional views of the various stages of manufacturing a semiconductor GAA FET device according to an embodiment of the present disclosure.

After the structure shown in FIG. 10 is formed, a dielectric stressor layer 55 is formed in the source/drain space 21. In some embodiments, the dielectric stressor layer 55 includes one or more layers of dielectric materials. In some embodiments, as shown in FIG. 23, a first dielectric stressor layer 52 and a second dielectric stressor layer 54 having an internal stress different from the first dielectric layer 52 are formed in the source/drain space 21.

For an n-type FET, a tensile stress is applied to the second semiconductor layers 25 by the dielectric stressor layers. In some embodiments, the second dielectric stressor layer 54 has a higher tensile stress than the first dielectric stressor layer 52. In other embodiments, the second dielectric stressor layer 54 has a lower tensile stress than the first dielectric stressor layer 52. For a p-type FET, a compressive stress is applied to the second semiconductor layers 25 by the dielectric stressor layers. In some embodiments, the second dielectric stressor layer 54 has a higher compressive stress than the first dielectric stressor layer 52. In some embodiments, the second dielectric stressor layer 54 has a lower compressive stress than the first dielectric stressor layer 52.

The stress directions (tensile or compressive) and the amount of stress can be adjusted by adjusting one or more parameters in a film formation method. In some embodiments, the first and second dielectric stressor layers 52 and 54 are made of silicon nitride formed from $SiH_4$ (and/or $Si_2H_6$) and $NH_3$, i.e., hydrogenated silicon nitride (SiN: H), using plasma or thermal CVD methods. In other embodiments, after a silicon nitride film is formed, an ion implantation process is performed to introduce ions of one or more of Si, N, O, Ge, Ar or He. The stress properties of the hydrogenated silicon nitride film depend on the amount of hydrogen in the film, an amount of impurities and/or a thickness of the film. By adjusting one or more parameters of the film formation process, the amount of hydrogen contained in the hydrogenated silicon nitride film can be adjusted. In some embodiments, a tensile stress silicon nitride film can be manufactured by LPCVD or PECVD process. In some embodiments, the use of LPCVD can create a high-tensile-stress $Si_3N_4$ films up to 2 Gpa. When PECVD is used the tensile stress may be about 1 GPa.

In some embodiments, the first dielectric stressor layer 52 is conformally formed in the source/drain space 21 and the second dielectric stressor layer 54 is formed to fully fill the source/drain space 21. In some embodiments, a thickness of the first dielectric stressor layer 52 is in a range from about 1 nm to about 5 nm.

Then, similar to FIG. 12, a dielectric layer 70A is formed over the epitaxial stressor layer 50 and the dummy gate structure as shown in FIG. 24.

Figures 25, 26:
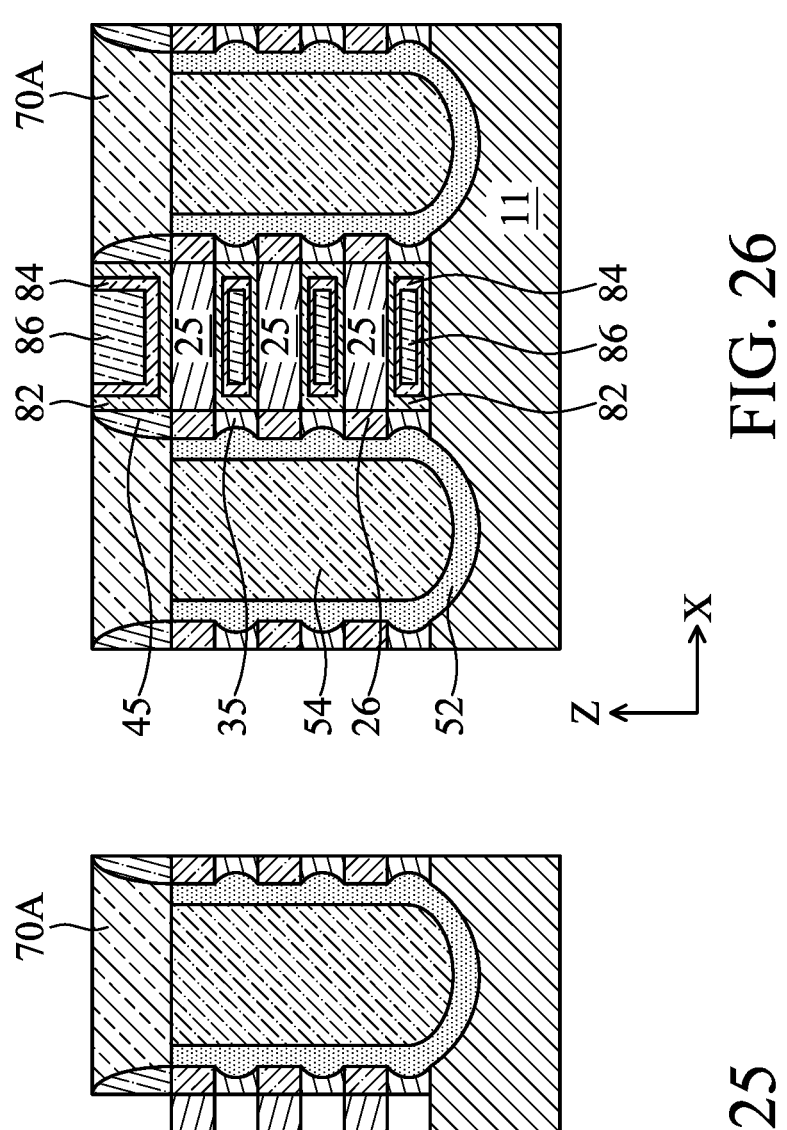

Next, similar to FIG. 13, the dummy gate electrode layer 42 and the sacrificial gate dielectric layer 41 are removed, and the first semiconductor layers 20 are removed, thereby forming wires or sheets (channel regions) of the second semiconductor layers 25 as shown in FIG. 25. After the semiconductor wires or sheets (channel regions) of the second semiconductor layers 25 are formed, similar to FIG. 14, a metal gate structure is formed as shown in FIG. 26.

Figure 28:
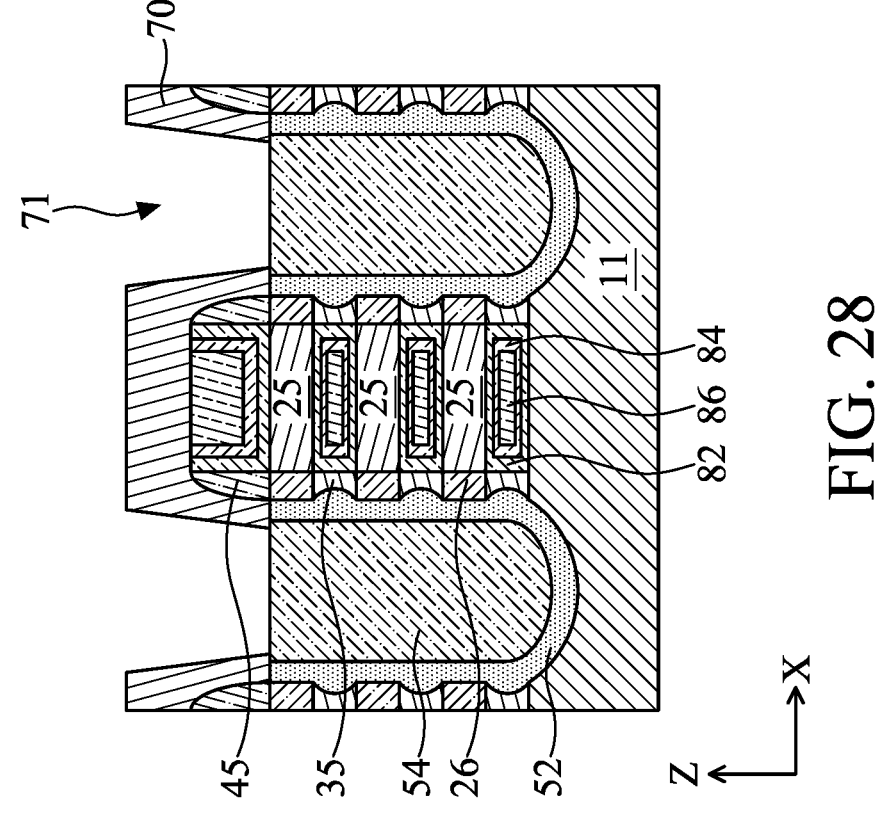
Figure 27:
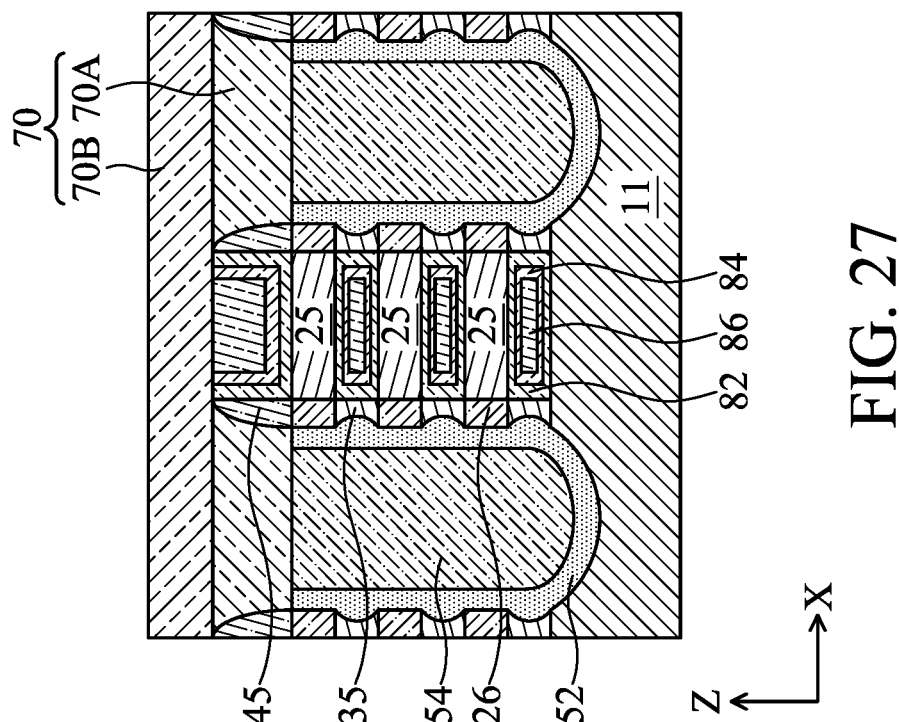

Subsequently, similar to FIG. 15, an additional dielectric layer 70B is formed over the dielectric layer 70A and the metal gate structure, as shown in FIG. 27. Then, similar to FIG. 16, an opening 71 is formed in the ILD layer 70 by using one or more lithography and etching operations to expose an upper surface of the epitaxial stressor layer, as shown in FIG. 28.

Figures 29, 30:
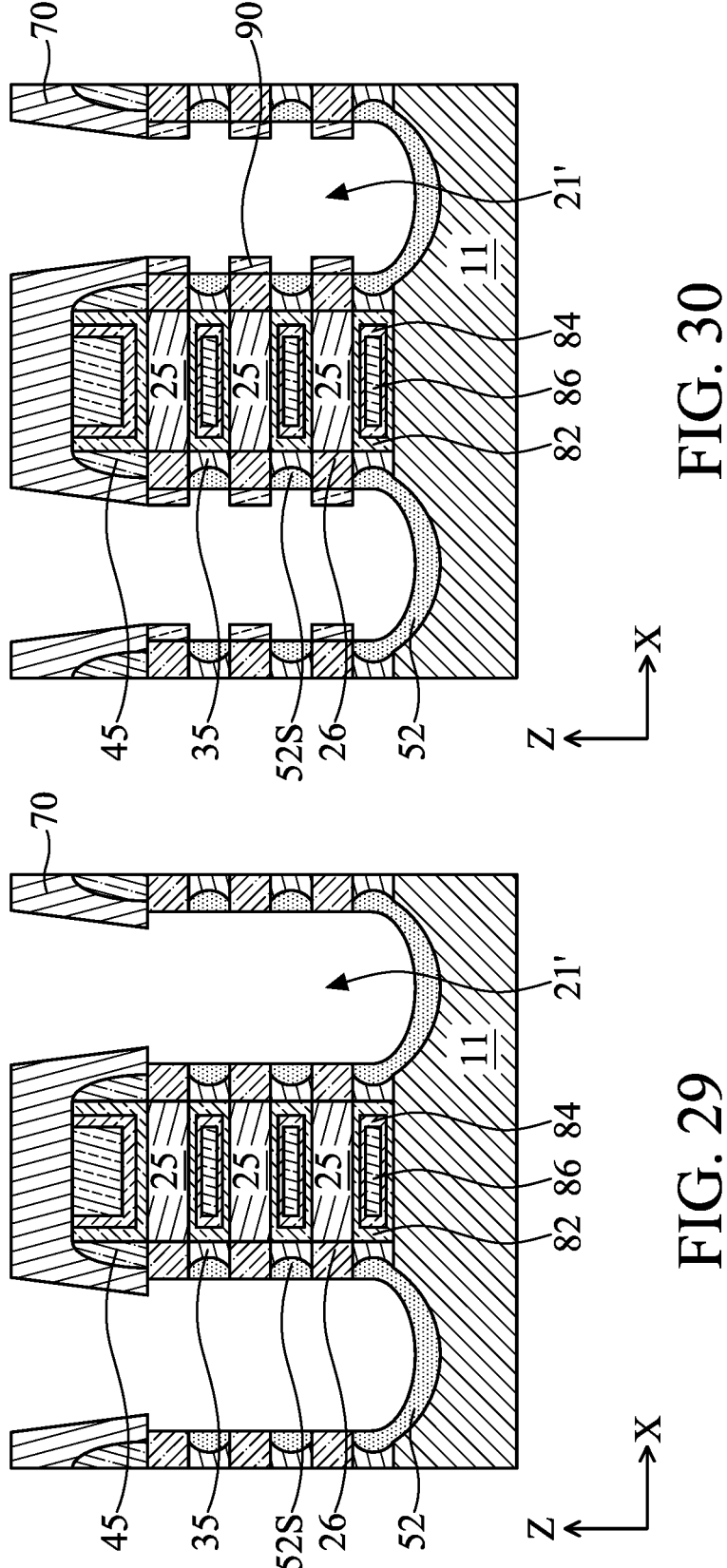

Next, the second dielectric stressor layer 54 is selectively removed through the opening 71, thereby reforming a source/drain space 21', as shown in FIG. 29. Since the internal stress of the second dielectric stressor layer 54 is sufficiently different from the internal stress of the first dielectric stressor layer 52, the second dielectric stressor layer 54 can be removed by dry and/or wet etching selective to the first dielectric stressor layer 52. As set forth above, even after the second dielectric stressor layer 54 is removed, the stress imposed by the second dielectric stressor layer 54 is held and maintained by the metal gate structure.

After the second dielectric stressor layer 54 is removed, similar to FIG. 20, a second extension semiconductor layer 90 is formed on the first extension layer 26, as shown in FIG.

Figures 31, 32:
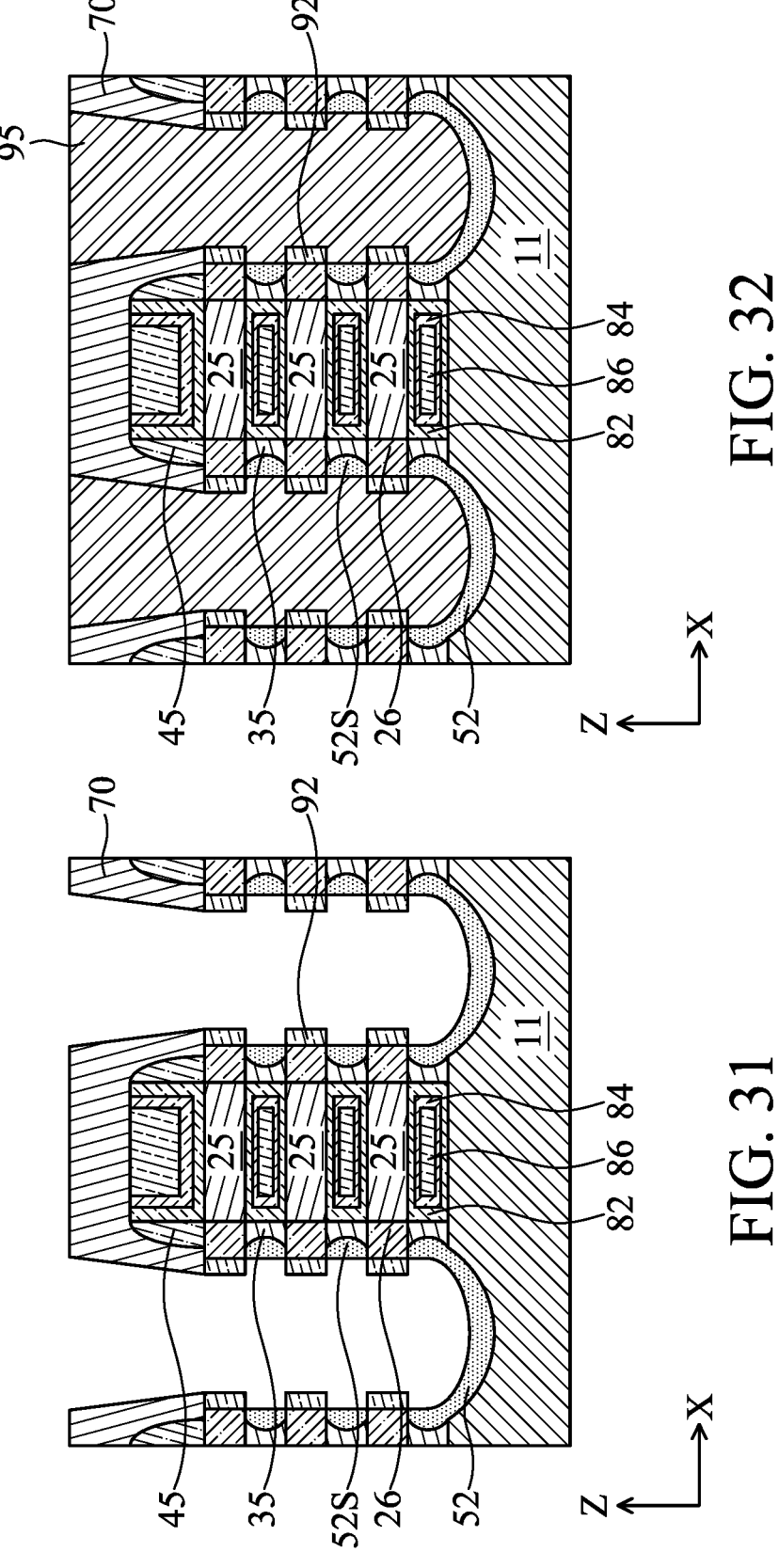

30. Then, similar to FIG. 21, an alloy layer (e.g., silicide layer) 92 is formed on the second extension layer 90, as shown in FIG. 31. Further, similar to FIG. 22, one or more conductive layers are formed in the source/drain space 21' to form a source/drain (S/D) contact 95 as shown in FIG. 32. It is understood that the GAA FETs undergo further CMOS processes to form various features such as contacts/vias, interconnect metal layers, dielectric layers, passivation layers, etc.

FIGS. 33-46 show various stages of manufacturing a semiconductor FET device according to an embodiment of the present disclosure. It is understood that additional operations can be provided before, during, and after processes shown by FIGS. 33-46, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1A-1E, 2-8 and 9-32 may be employed in the embodiment of FIGS. 33-46, and detailed explanation thereof may be omitted. Although not shown in FIGS. 33-46, in some embodiments, the gate region and the source/drain region are repeatedly arranged in the X direction in the desired numbers depending on the design requirements (see, FIGS. 1A and 1E).

Figure 33:
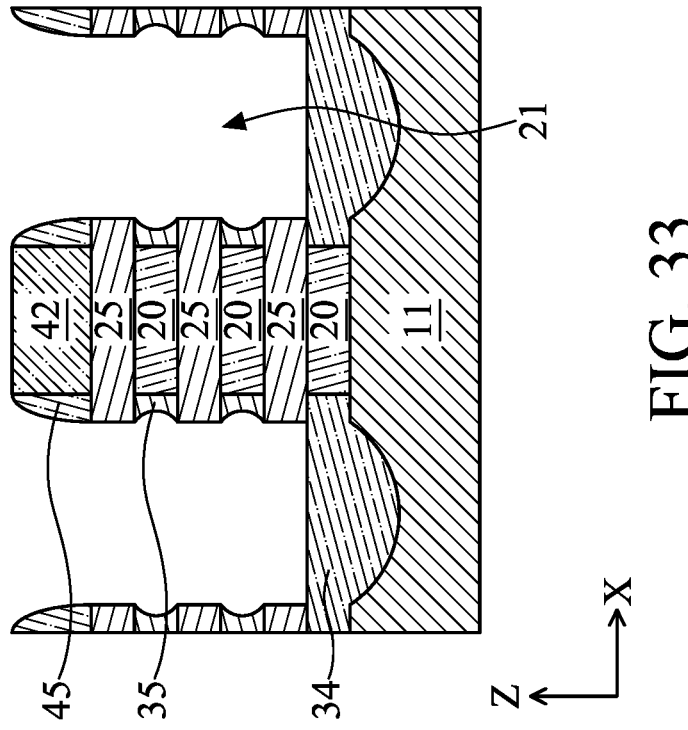

In some embodiments, when forming the inner spacers 35, a bottom of the first insulating layer 30 formed in the source/drain space 21 as shown in FIG. 7 is not fully removed and a part thereof remains as a remaining first insulating layer 34 as shown in FIG. 33. In some embodiments, the upper surface of the remaining first insulating layer 34 is located below the lower surface of the bottommost second semiconductor layer 25. In some embodiments, the upper surface of the remaining first insulating layer 34 is located above the lower surface of the bottommost first semiconductor layer 20. In other embodiments, the upper surface of the remaining first insulating layer 34 is located below the lower surface of the bottommost first semiconductor layer 20.

Figure 34:
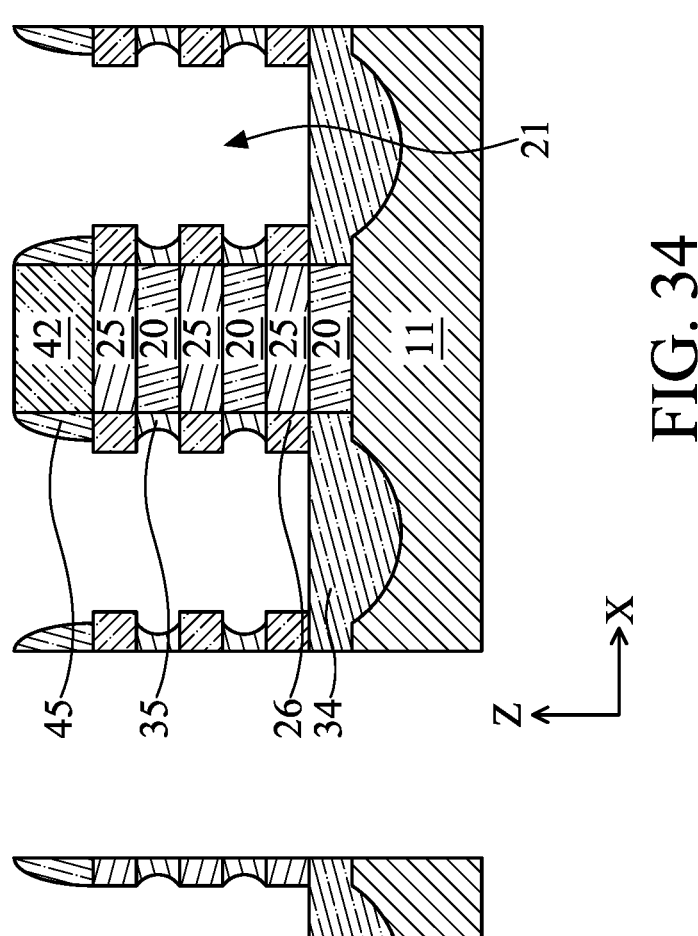
FIGS. 33, 34, 35, 36, 37, 38, 39, 40, 41 and 42 show cross sectional views of the various stages of manufacturing a semiconductor GAA FET device according to an embodiment of the present disclosure.

After the inner spacers 35 and the remaining first insulating layer 34 are formed, similar to FIG. 10, an epitaxial first extension layer 26 is formed on lateral end faces of the second semiconductor layer 25 in some embodiments, as shown in FIG. 34.

Figures 35, 36:
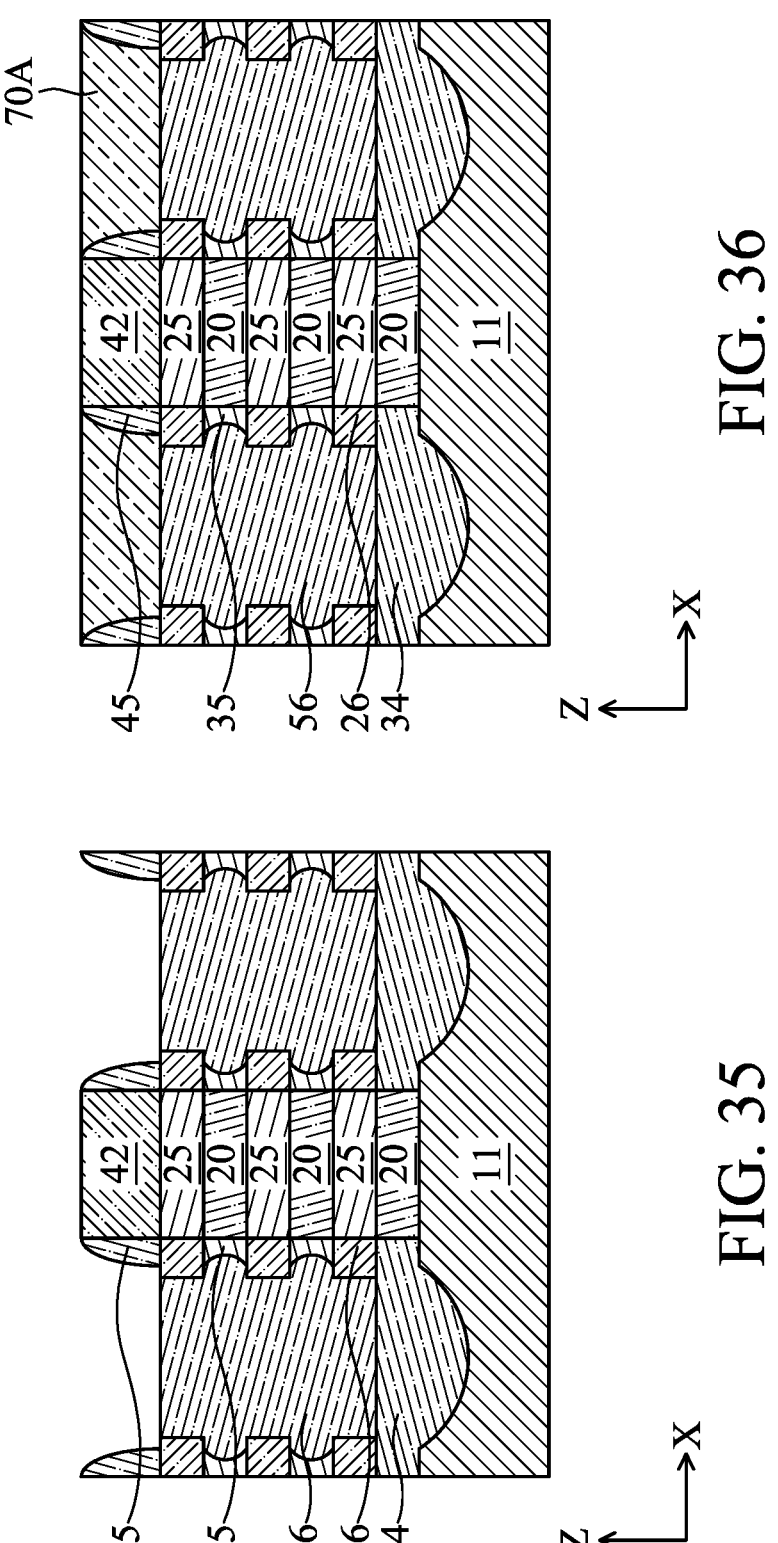

Subsequently, a dielectric stressor layer 56 is formed in the source/drain space 21 as shown in FIG. 35. In some embodiments, the dielectric stressor layer 55 includes one or more layers of dielectric materials. For an n-type FET, a tensile stress is applied to the second semiconductor layers 25 by the dielectric stressor layer 56. For a p-type FET, a compressive stress is applied to the second semiconductor layers 25 by the dielectric stressor layer 56. In some embodiments, the dielectric stressor layer 56 is made of silicon nitride formed from $SiH_4$ (and/or $Si_2H_6$) and $NH_3$, i.e., hydrogenated silicon nitride (SiN: H), using plasma or thermal CVD methods. In other embodiments, after a silicon nitride film is formed, an ion implantation process is performed to introduce ions of one or more of Si, N, O, Ge, Ar or He. The stress properties of the hydrogenated silicon nitride film depend on the amount of hydrogen in the film, an amount of impurities and/or a thickness of the film. By adjusting one or more parameters of the film formation process, the amount of hydrogen contained in the hydrogenated silicon nitride film can be adjusted. In some embodiments, the dielectric stressor layer 56 is made of a different material than the first insulating layer 34.

Then, similar to FIGS. 12 and 24, a dielectric layer 70A is formed over the epitaxial stressor layer 50 and the dummy gate structure as shown in FIG. 36.

Figures 37, 38:
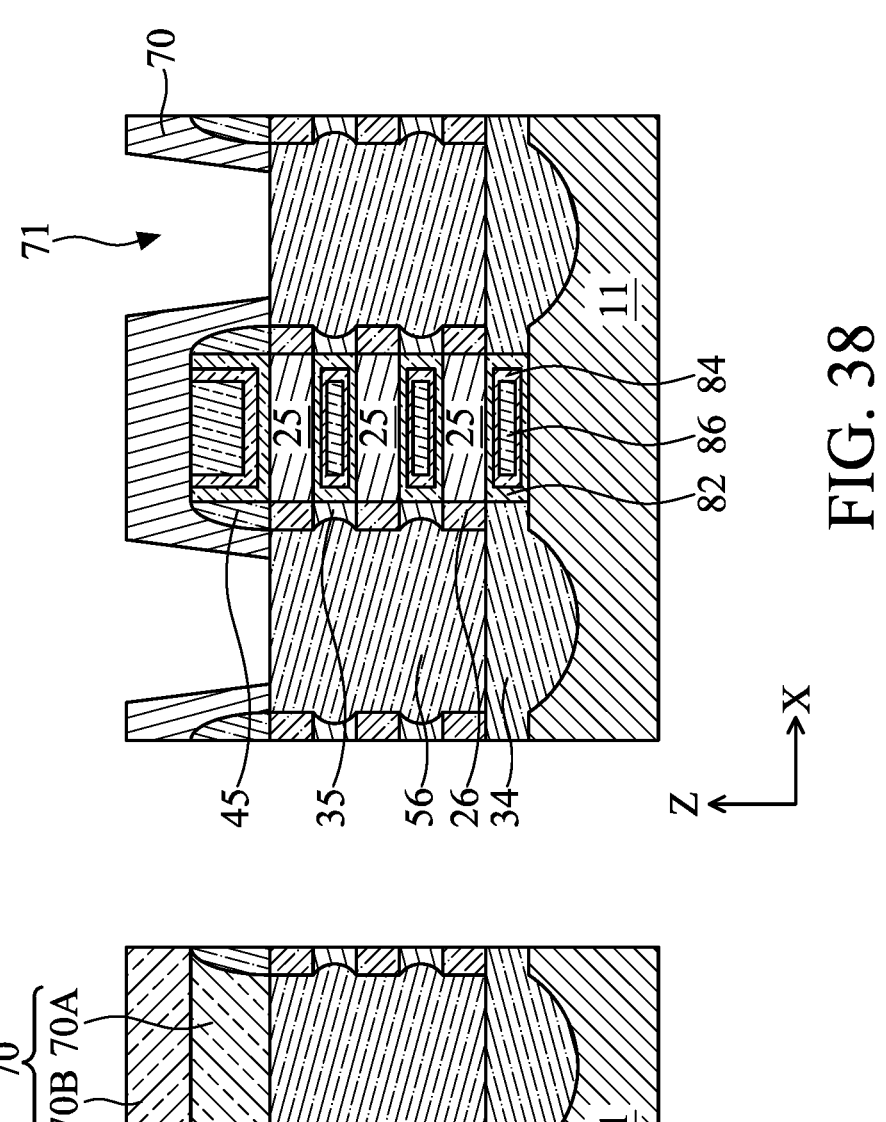

Next, similar to FIGS. 13-15 and 25-27, the dummy gate electrode layer 42 and the sacrificial gate dielectric layer 41 are removed, and the first semiconductor layers 20 are removed, thereby forming wires or sheets (channel regions) of the second semiconductor layers 25. After the semiconductor wires or sheets (channel regions) of the second semiconductor layers 25 are formed, a metal gate structure is formed, and subsequently, an additional dielectric layer 70B is formed over the dielectric layer 70A and the metal gate structure, as shown in FIG. 37. Then, similar to FIGS. 16 and 28, an opening 71 is formed in the ILD layer 70 by using one or more lithography and etching operations to expose an upper surface of the epitaxial stressor layer, as shown in FIG. 38.

Figures 39, 40:
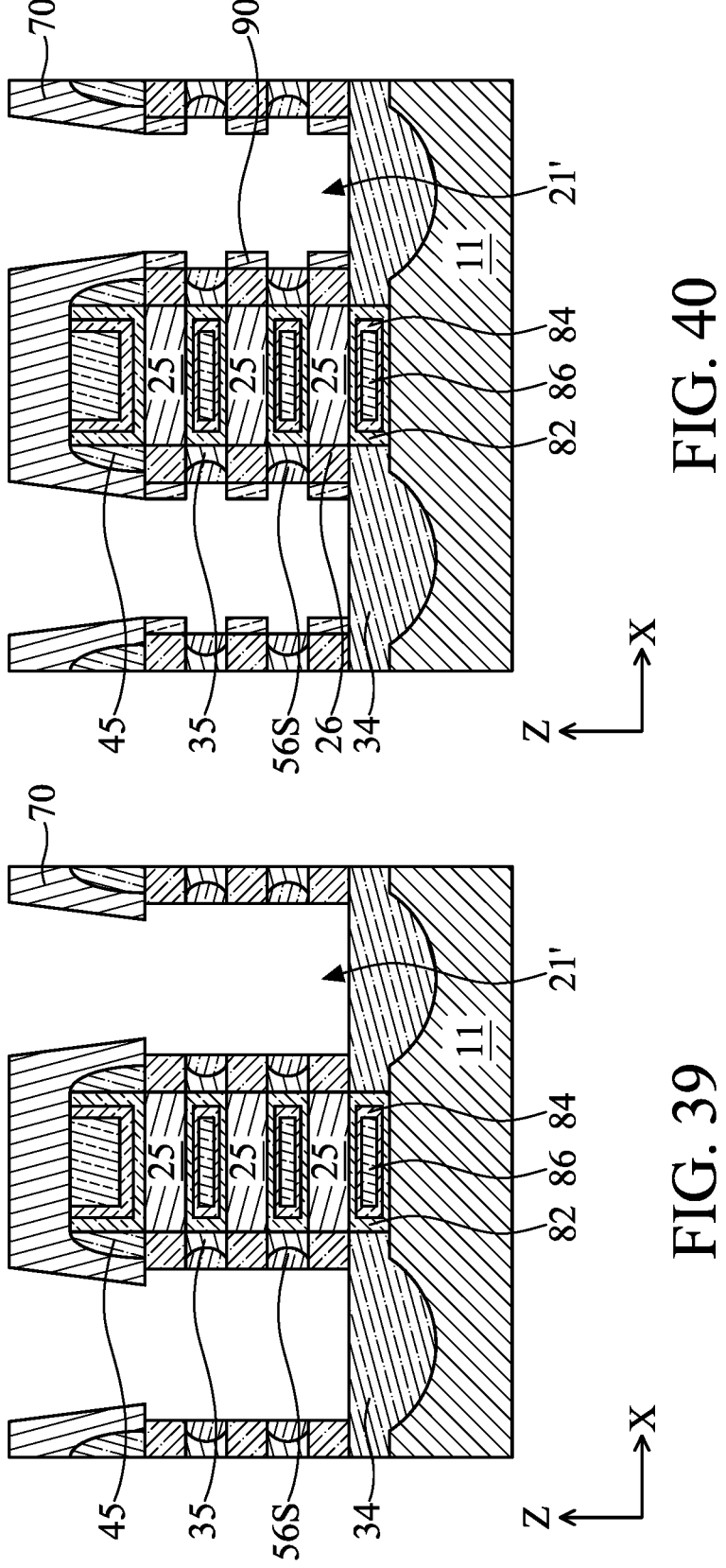

Next, the dielectric stressor layer 56 is selectively removed through the opening 71, thereby reforming a source/drain space 21', as shown in FIG. 39. Since the internal stress of the dielectric stressor layer 56 is sufficiently different from the internal stress of the remaining first insulating layer 34, the dielectric stressor layer 56 can be removed by dry and/or wet etching selective to the remaining first insulating layer 34. As set forth above, even after the dielectric stressor layer 56 is removed, the stress imposed by the dielectric stressor layer 56 is held and maintained by the metal gate structure. As shown in FIG. 39, a part of the dielectric stressor layer 56 remains on the inner spacer 35 as an additional inner spacer 56S.

Figures 41, 42:
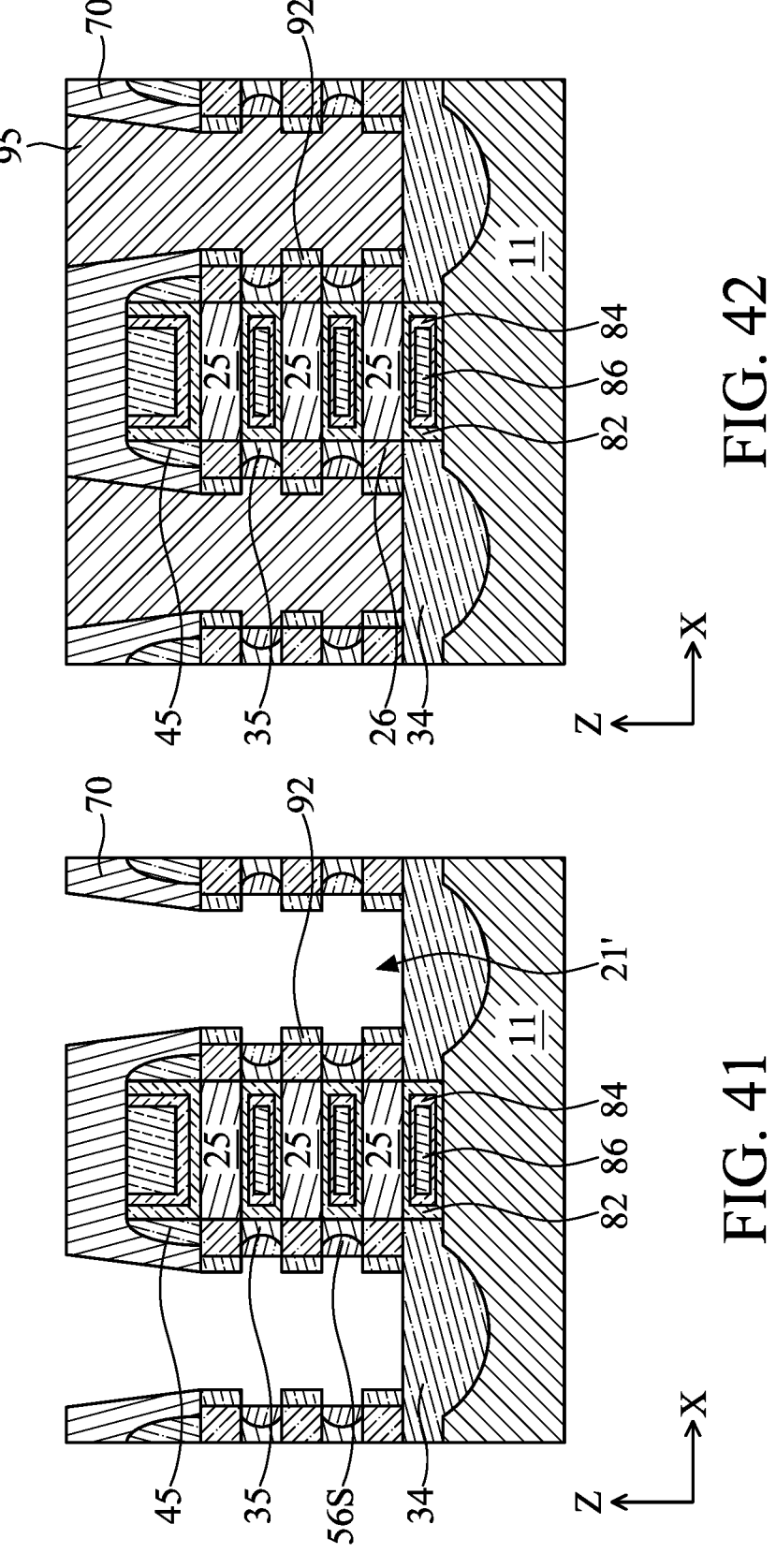

After the dielectric stressor layer 56 is removed, similar to FIGS. 20 and 30, a second extension semiconductor layer 90 is formed on the first extension layer 26, as shown in FIG. 40. Then, similar to FIGS. 21 and 31, an alloy layer (e.g., silicide layer) 92 is formed on the second extension layer 90, as shown in FIG. 41. Further, similar to FIGS. 22 and 32, one or more conductive layers are formed in the source/drain space 21' to form a source/drain (S/D) contact 95 as shown in FIG. 42. It is understood that the GAA FETs undergo further CMOS processes to form various features such as contacts/vias, interconnect metal layers, dielectric layers, passivation layers, etc.

Figures 43, 44:
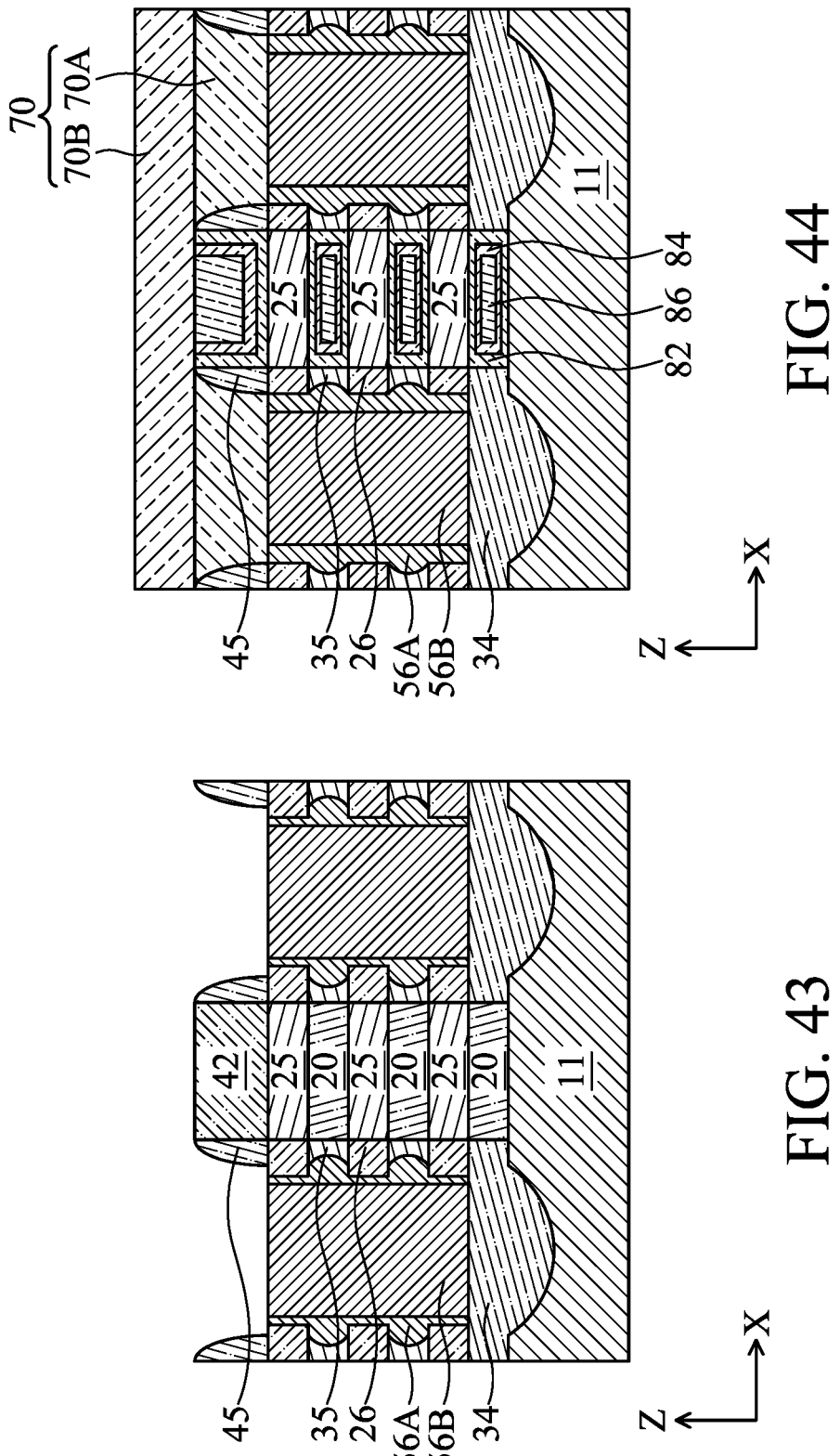
FIGS. 43, 44, 45 and 46 show cross sectional views of the various stages of manufacturing a semiconductor GAA FET device according to an embodiment of the present disclosure.

In some embodiments, as shown in FIG. 43, the dielectric stressor layer 56 includes a first dielectric stressor layer 56A and a second dielectric stressor layer 56B similar to the first dielectric stressor layer 52 and the second dielectric stressor layer 54 as set forth above.

For an n-type FET, a tensile stress is applied to the second semiconductor layers 25 by the dielectric stressor layers. In some embodiments, the second dielectric stressor layer 56B has a higher tensile stress than the first dielectric stressor layer 56A. In other embodiments, the second dielectric stressor layer 56B has a lower tensile stress than the first dielectric stressor layer 56A. For a p-type FET, a compressive stress is applied to the second semiconductor layers 25 by the dielectric stressor layers. In some embodiments, the second dielectric stressor layer 56B has a higher compressive stress than the first dielectric stressor layer 56A. In some embodiments, the second dielectric stressor layer 56B has a lower compressive stress than the first dielectric stressor layer 56A.

The stress directions (tensile or compressive) and the amount of stress can be adjusted by adjusting one or more parameters in a film formation method. In some embodiments, the first and second dielectric stressor layers 56A and 56B are made of silicon nitride formed from $SiH_4$ (and/or $Si_2H_6$) and $NH_3$, i.e., hydrogenated silicon nitride (SiN:H), using plasma or thermal CVD methods. In other embodiments, after a silicon nitride film is formed, an ion implantation process is performed to introduce ions of one or more of Si, N, O, Ge, Ar or He. The stress properties of the hydrogenated silicon nitride film depend on the amount of hydrogen in the film, an amount of impurities and/or a thickness of the film. By adjusting one or more parameters of the film formation process, the amount of hydrogen contained in the hydrogenated silicon nitride film can be adjusted.

In some embodiments, after the first dielectric stressor layer 56A is conformally formed, one or more anisotropic etching operations are performed to expose a part of the remaining first insulating layer 34, and then the second dielectric stressor layer 56B is formed, as shown in FIG. 43. In other embodiments, the second dielectric stressor layer 56B is sequentially formed on the first dielectric stressor layer 56A and thus the second dielectric stressor layer 56B is not in direct contact with the remaining first insulating layer 34.

Next, similar to FIGS. 13-15 and 25-27, the dummy gate electrode layer 42 and the sacrificial gate dielectric layer 41 are removed, and the first semiconductor layers 20 are removed, thereby forming wires or sheets (channel regions) of the second semiconductor layers 25. After the semiconductor wires or sheets (channel regions) of the second semiconductor layers 25 are formed, a metal gate structure is formed, and subsequently, an additional dielectric layer 70B is formed over the dielectric layer 70A and the metal gate structure, as shown in FIG. 44.

Figures 45, 46:
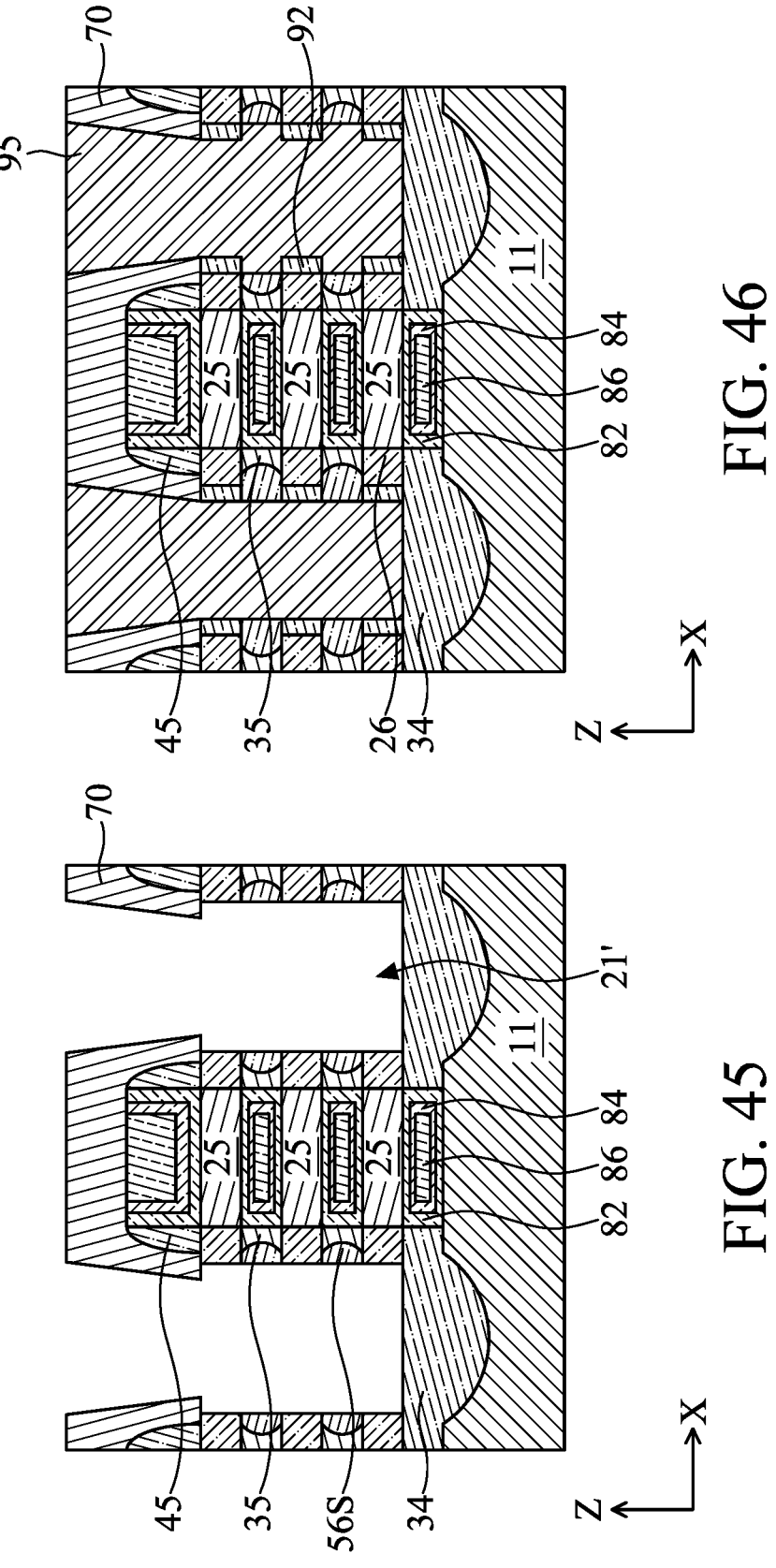

Then, similar to FIGS. 16 and 28, an opening 71 is formed in the ILD layer 70 by using one or more lithography and etching operations to expose an upper surface of the epitaxial stressor layer. Next, the second dielectric stressor layer 56B is selectively removed through the opening 71, thereby reforming a source/drain space 21', as shown in FIG. 45. Since the internal stress of the second dielectric stressor layer 56B is sufficiently different from the internal stress of the first dielectric stressor layer 56A and the remaining first insulating layer 34, the second dielectric stressor layer 56N can be removed by dry and/or wet etching selective to the first dielectric stressor layer 56A and the remaining first insulating layer 34. As set forth above, even after the second dielectric stressor layer 56B is removed, the stress imposed by the dielectric stressor layer 56B is held and maintained by the metal gate structure.

After the dielectric stressor layer 56 is removed, similar to FIGS. 20-22 and 30-32, a second extension semiconductor layer 90 is formed on the first extension layer 26, an alloy layer (e.g., silicide layer) 92 is formed on the second extension layer 90, and one or more conductive layers are formed in the source/drain space 21' to form a source/drain (S/D) contact 95 as shown in FIG. 46. It is understood that the GAA FETs undergo further CMOS processes to form various features such as contacts/vias, interconnect metal layers, dielectric layers, passivation layers, etc.

FIGS. 47-54 show various stages of manufacturing a semiconductor FET device according to an embodiment of the present disclosure. It is understood that additional operations can be provided before, during, and after processes shown by FIGS. 47-54, and some of the operations described below can be replaced or eliminated, for additional embodiments of the method. The order of the operations/processes may be interchangeable. Material, configuration, dimensions and/or processes the same as or similar to the foregoing embodiments described with respect to FIGS.

1A-1E, 2-8 and 9-46 may be employed in the embodiment of FIGS. 47-54, and detailed explanation thereof may be omitted.

Figures 47, 48:
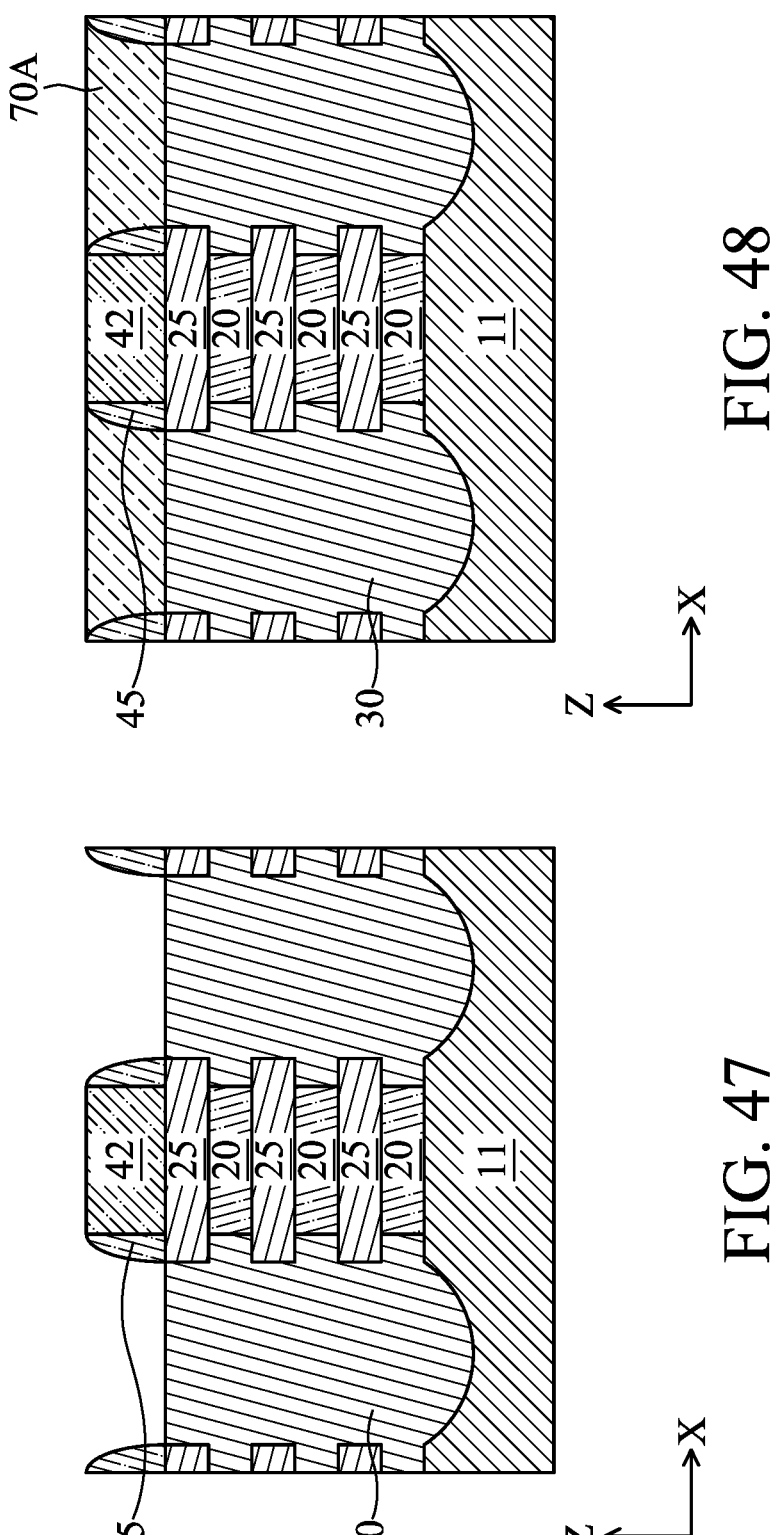
FIGS. 47, 48, 49, 50, 51, 52, 53 and 54 show cross sectional views of the various stages of manufacturing a semiconductor GAA FET device according to an embodiment of the present disclosure.

FIG. 47 is consistent with FIG. 7. In some embodiments, the first insulating layer 30 has a tensile or compressive internal stress to apply stress to the second semiconductor layers 25. For an n-type FET, a tensile stress is applied to the second semiconductor layers 25 by the first insulating layer 30. For a p-type FET, a compressive stress is applied to the second semiconductor layers 25 by the first insulating layer 30. In some embodiments, the first insulating layer 30 includes two or more layers, similar to the first and second dielectric stressor layers 52 and 54 as set forth above.

The stress directions (tensile or compressive) and the amount of stress can be adjusted by adjusting one or more parameters in a film formation method. In some embodiments, first insulating layer 30 is made of silicon nitride formed from $SiH_4$ (and/or $Si_2H_6$) and $NH_3$, i.e., hydrogenated silicon nitride (SiN: H), using plasma or thermal CVD methods. In other embodiments, after a silicon nitride film is formed, an ion implantation process is performed to introduce ions of one or more of Si, N, O, Ge, Ar or He. The stress properties of the hydrogenated silicon nitride film depend on the amount of hydrogen in the film, an amount of impurities and/or a thickness of the film. By adjusting one or more parameters of the film formation process, the amount of hydrogen contained in the hydrogenated silicon nitride film can be adjusted.

Then, similar to FIG. 12, a dielectric layer 70A is formed over the epitaxial stressor layer 50 and the dummy gate structure as shown in FIG. 48.

Figures 49, 50:
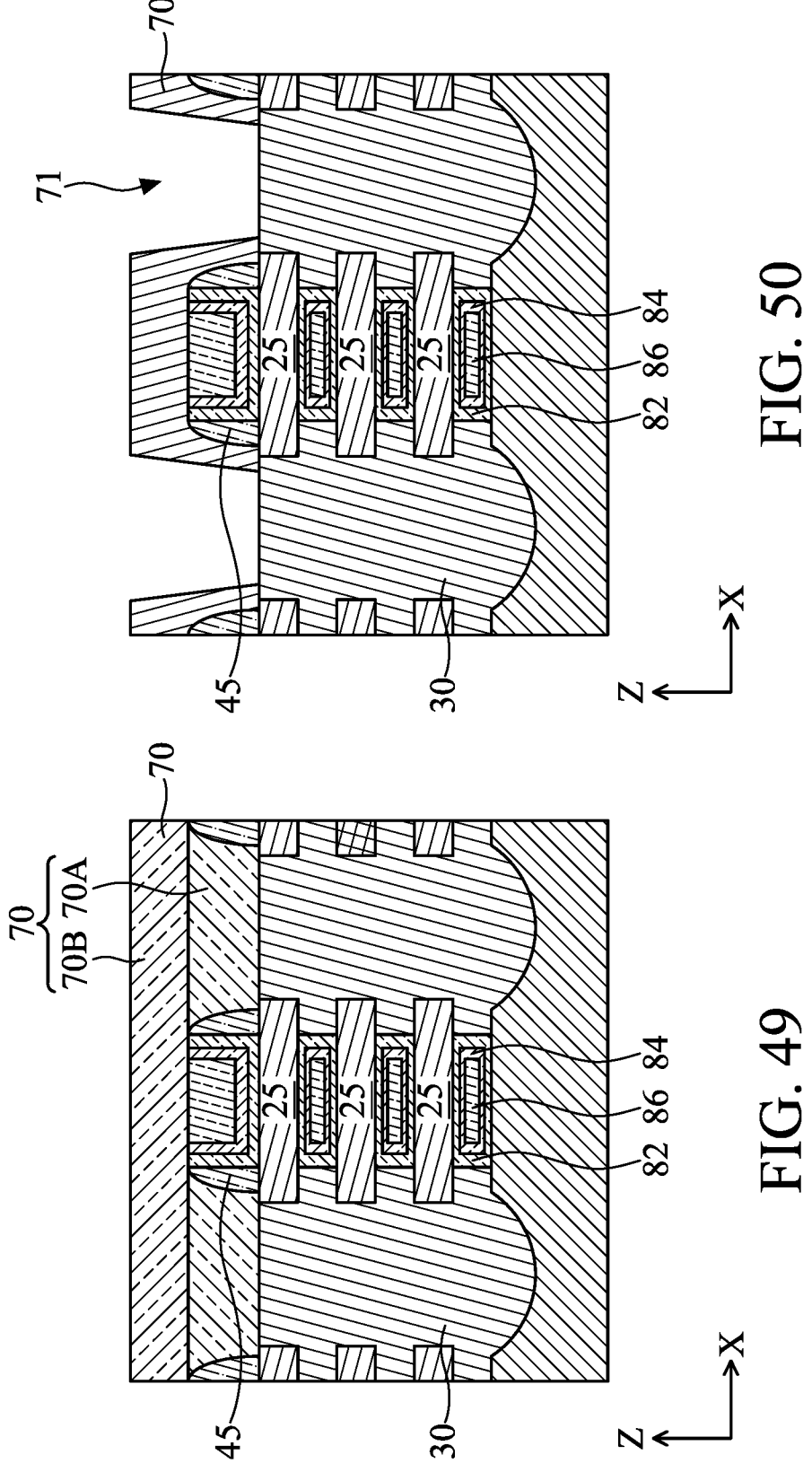

Next, similar to FIG. 13, the dummy gate electrode layer 42 and the sacrificial gate dielectric layer 41 are removed, and the first semiconductor layers 20 are removed, thereby forming wires or sheets (channel regions) of the second semiconductor layers 25. After the semiconductor wires or sheets (channel regions) of the second semiconductor layers 25 are formed, similar to FIG. 14, a metal gate structure is formed. Subsequently, similar to FIG. 15, an additional dielectric layer 70B is formed over the dielectric layer 70A and the metal gate structure, as shown in FIG. 49. Then, similar to FIG. 16, an opening 71 is formed in the ILD layer 70 by using one or more lithography and etching operations to expose an upper surface of the epitaxial stressor layer, as shown in FIG. 50.

Figures 51, 52:
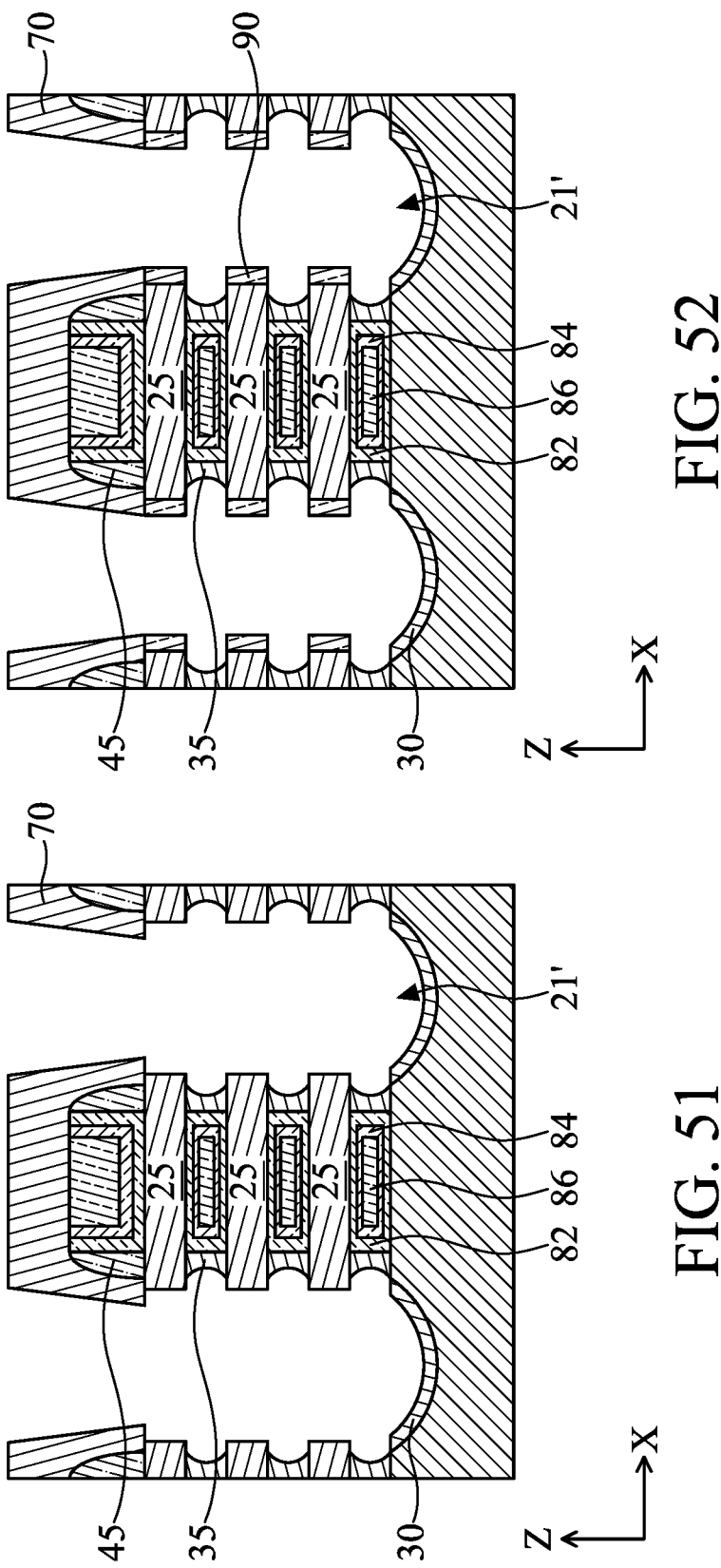

Next, a part of the first insulating layer 30 is removed through the opening 71, thereby reforming a source/drain space 21', as shown in FIG. 51. The thickness at the bottom of the source/drain space 21' of the first insulating layer 30 is in a range from about 1 nm to about 5 nm in some embodiments. The inner spacers 35 are also formed at the same time.

Figures 53, 54:
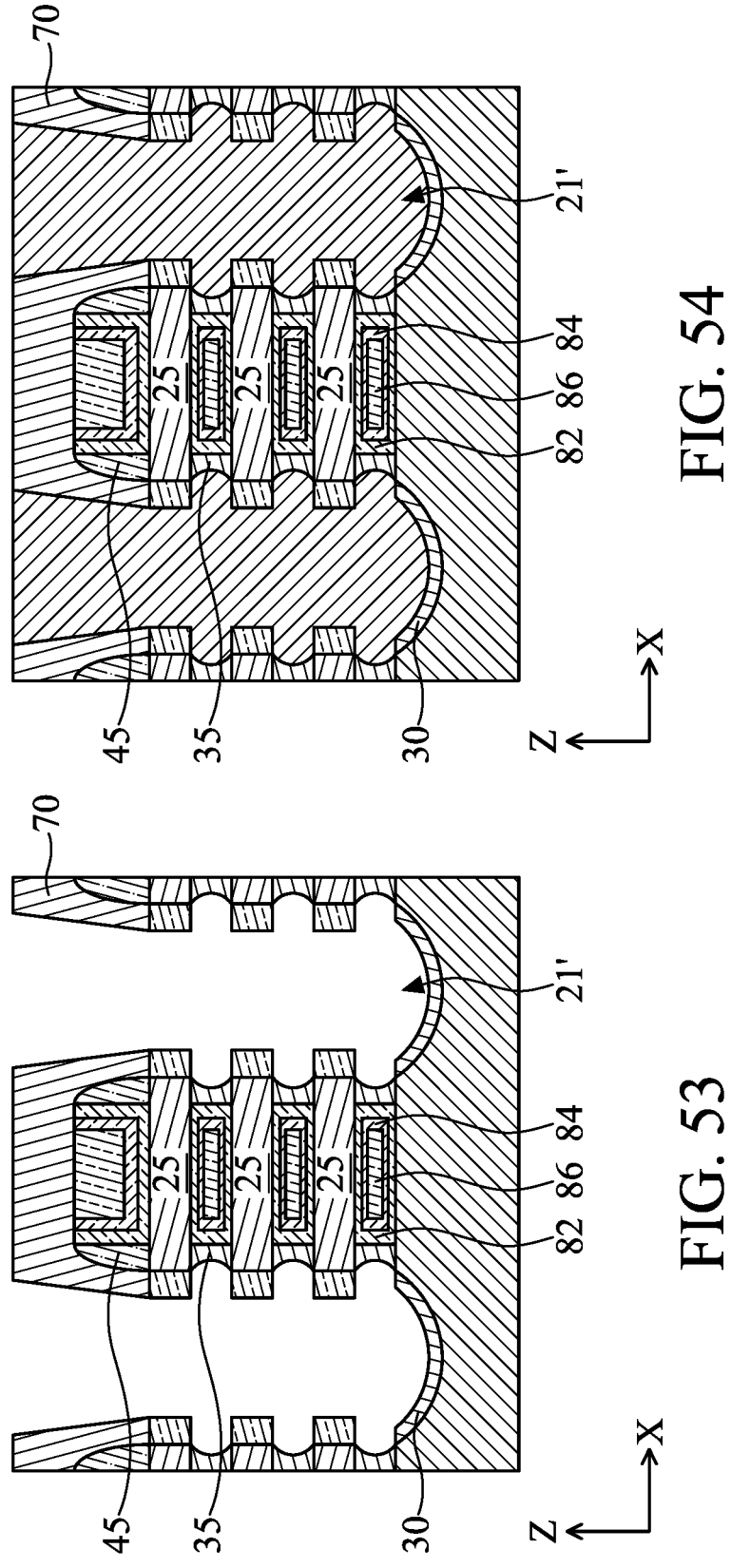

After the first insulating layer 30 is partially removed and the inner spacers 35 are formed, similar to FIG. 20, a second extension semiconductor layer 90 is formed on the end faces of the second semiconductor layers 25, as shown in FIG. 52. In some embodiments, before the second extension semiconductor layer 90 is formed, a first extension layer 26 is formed on the end faces of the second semiconductor layers 25. Then, similar to FIG. 21, an alloy layer (e.g., silicide layer) 92 is formed on the second extension layer 90, as shown in FIG. 53. Further, similar to FIG. 22, one or more conductive layers are formed in the source/drain space 21' to form a source/drain (S/D) contact 95 as shown in FIG. 54. It is understood that the GAA FETs undergo further CMOS processes to form various features such as contacts/vias, interconnect metal layers, dielectric layers, passivation layers, etc.

In the present disclosure, the source/drain region of the GAA FET does not include an epitaxial stressor layer, for example, SiP, SiCP and/or SiC for an n-type FET and SiGe for a p-type FET, but the channel layers 25 experiences and maintains the stress applied by the epitaxial stressor layer 50. Further, since no epitaxial stressor layer (having generally higher resistance than the metal or metallic material) exists and the metal or metallic S/D contact 95 directly contacts the source/drain regions of the channel layers 25, it is possible to reduce resistance at the source/drain region. In addition, since the bottom of the S/D contact 95 is isolated by the substrate 10 and the mesa structure 11 by the dielectric layer 49 and no semiconductor stressor layer remains, it is possible to reduce a source-to-drain leak current, and to reduce parasitic junction capacitances between the semiconductor stressor layer and the substrate 11 and between the gate and the source/drain. Further, the silicide layer 92 directly contacts the extension layer 26 and/or the channel semiconductor layer 25 and the S/D contact 95, which can reduce the contact resistance.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, a fin structure in which first semiconductor layers and second semiconductor layers are alternately stacked is formed, a sacrificial gate structure is formed over the fin structure, a source/drain region of the fin structure, which is not covered by the sacrificial gate structure, is etched thereby forming a source/drain space, a stressor layer is formed in the source/drain space, a metal gate structure including part of the second semiconductor layer as channel regions is formed by a gate replacement process, after the metal gate structure is formed, the stressor layer is at least partially removed, and a source/drain contact comprising metal or a metallic material is formed in the source/drain space from which the stressor layer is at least partially removed. In one or more of the foregoing and following embodiments, the stressor layer includes a semiconductor material having a lattice constant different from the second semiconductor layers. In one or more of the foregoing and following embodiments, the stressor layer is fully removed. In one or more of the foregoing and following embodiments, after the stressor layer is fully removed, the source/drain space is filled with a dielectric material, and a dielectric layer is formed by partially removing the dielectric material. The source/drain contact is formed on the dielectric layer. In one or more of the foregoing and following embodiments, after the stressor layer is fully removed and before the dielectric material is filled in the source/drain space, a first extension semiconductor layer is formed on an end face of each of the second semiconductor layers. After the dielectric layer is formed, a side face of the first extension semiconductor layer is exposed in the source/drain space. In one or more of the foregoing and following embodiments, the first extension semiconductor layer includes dopant, and a doping concentration of the first extension semiconductor layer is greater than a doping concentration of the second semiconductor layers. In one or more of the foregoing and following embodiments, after the dielectric layer is formed, a second extension semiconductor layer is formed on the side face of the first extension semiconductor layer, and a silicide layer is formed on the second extension semiconductor layer or by converting the second extension semiconductor layer into the silicide layer. In one or more of the foregoing and following embodiments, before the stressor layer is formed, inner spacers made of a dielectric material are formed on end faces of the first semiconductor layers. In one or more of the foregoing and following embodiments, a part of the dielectric material is formed on each of the inner spacers as an additional inner spacer.

In accordance with another aspect of the present disclosure, in a method of manufacturing a semiconductor device, a fin structure in which first semiconductor layers and second semiconductor layers are alternately stacked is formed, a sacrificial gate structure is formed over the fin structure, a source/drain region of the fin structure, which is not covered by the sacrificial gate structure, is etched thereby forming a source/drain space, the first semiconductor layers are laterally etched through the source/drain space, a first inner spacer made of a dielectric material is formed on an end of each of the etched first semiconductor layers, a first extension semiconductor layer is formed on an end face of each of the second semiconductor layers in the source/drain space, a stressor layer is formed in the source/drain space, a first dielectric layer is formed over the stressor layer, a gate space is formed by removing the sacrificial gate structure, the first semiconductor layers are removed in the gate space, thereby releasing the second semiconductor layers as channel regions, a metal gate structure is formed around the second semiconductor layers, after the metal gate structure is formed, the stressor layer is at least partially removed, a dielectric liner layer is formed in the source/drain space, an alloy layer is formed over the end face of each of the second semiconductor layers, and a source/drain contact comprising metal or a metallic material is formed in contact with the alloy layer. In one or more of the foregoing and following embodiments, a bottom of the source/drain contact is located closer to a substrate than a bottom face of one of the semiconductor layers closest to the substrate. In one or more of the foregoing and following embodiments, the source/drain contact is separated from the substrate by the dielectric liner layer. In one or more of the foregoing and following embodiments, when the dielectric liner layer is formed, a second inner spacer is formed over the first inner spacer. In one or more of the foregoing and following embodiments, the alloy layer formed over an end face of one of the second semiconductor layers is separated by the second inner spacer from the alloy layer formed over an end face of an adjacent one of the second semiconductor layers. In one or more of the foregoing and following embodiments, when the alloy layer is formed, a second extension semiconductor layer is formed on the first extension semiconductor layer, a metal layer is formed on the second extension semiconductor layer, and a thermal operation is performed to form the alloy layer from the second extension semiconductor layer and the metal layer.

In accordance with another aspect of the present disclosure, in a method of manufacturing a semiconductor device, a fin structure in which first semiconductor layers and second semiconductor layers are alternately stacked, is formed, a sacrificial gate structure is formed over the fin structure, a source/drain region of the fin structure, which is not covered by the sacrificial gate structure, is etched thereby forming a source/drain space, a first dielectric stressor layer is formed in the source/drain space, a second dielectric stressor layer having an internal stress different from the first dielectric stressor layer is formed over the first dielectric stressor layer, a metal gate structure including part of the second semiconductor layer as channel regions is formed by a gate replacement process, after the metal gate structure is formed, the second dielectric stressor layer is removed, and a source/drain contact comprising metal or a metallic material is formed in the source/drain space from which the second dielectric stressor layer is removed. In one or more of the foregoing and following embodiments, the first and second dielectric stressor layers include hydrogenated silicon nitride, and a hydrogen amount of the second dielectric stressor layer is different from a hydrogen amount of the first dielectric stressor layer. In one or more of the foregoing and following embodiments, the source/drain contact is separated from a substrate by the first dielectric stressor layer. In one or more of the foregoing and following embodiments, a bottom dielectric layer is formed at a bottom portion of the source/drain contact before the first dielectric stressor layer is formed, and the source/drain contact is separated from a substrate by the bottom dielectric stressor layer. In one or more of the foregoing and following embodiments, an inner spacer is formed on an end of each of the first semiconductor layers, and the bottom dielectric layer and the inner spacers are made of a same material.

In accordance with another aspect of the present disclosure, a semiconductor device includes: a plurality of semiconductor bodies disposed and vertically arranged over a substrate, each of the plurality of semiconductor bodies including a channel region and a source/drain region; a gate dielectric layer disposed on and wrapping around the channel region of each of the plurality of semiconductor bodies; a gate electrode layer disposed on the gate dielectric layer and wrapping around each channel region; an alloy layer disposed on an lateral end face of the source/drain region of each of the plurality of semiconductor bodies; and a source/drain contact comprising metal or metallic material in contact with the alloy layer. In one or more of the foregoing and following embodiments, a bottom of the source/drain contact is located closer to the substrate than a bottom face of a bottommost one of the plurality of semiconductor bodies. In one or more of the foregoing and following embodiments, the semiconductor device further includes a dielectric liner layer disposed between the source/drain contact and the substrate. In one or more of the foregoing and following embodiments, the semiconductor device further includes a first inner spacer disposed on a lateral end face of the gate dielectric layer disposed between adjacent semiconductor bodies. In one or more of the foregoing and following embodiments, the semiconductor device further includes a second inner spacer disposed on the first inner spacer and made of a same material as the dielectric liner layer. In one or more of the foregoing and following embodiments, a dopant concentration of the source/drain region gradually increases from the channel region toward the source/drain contact. In one or more of the foregoing and following embodiments, the source/drain contact includes one or more layers of Ti, TiN, Ta, TaN, Co or W. In one or more of the foregoing and following embodiments, the channel region is coupled to the source/drain contact without interposing a semiconductor crystal material having a lattice constant different from the channel region.

In accordance with another aspect of the present disclosure, a semiconductor device includes: a substrate including a mesa structure having a bottom fin portion and a source/drain recess portion; a plurality of semiconductor bodies disposed and vertically arranged over the bottom fin portion, each of the plurality of semiconductor bodies including a channel region and a source/drain region; a gate structure wrapping around the channel region of each of the plurality of semiconductor bodies; a source/drain contact comprising metal or metallic material; and a dielectric liner layer disposed between the source/drain contact and the source/drain recess portion. In one or more of the foregoing and following embodiments, a bottom part of the source/drain contact is located at the source/drain recess portion. In one or more of the foregoing and following embodiments, a bottom of the source/drain contact is located closer to the substrate than a bottom face of a bottommost one of the plurality of semiconductor bodies. In one or more of the foregoing and following embodiments, the semiconductor device further includes a first inner spacer disposed on a lateral end face of the gate structure disposed between adjacent semiconductor bodies. In one or more of the foregoing and following embodiments, the semiconductor device further includes a second inner spacer disposed on the first inner spacer and made of a same material as the dielectric liner layer. In one or more of the foregoing and following embodiments, the semiconductor device further includes a second inner spacer disposed on the first inner spacer and made of a different material than the dielectric liner layer. In one or more of the foregoing and following embodiments, the dielectric liner layer includes silicon nitride.

In accordance with another aspect of the present disclosure, a semiconductor device includes a first gate-all-around field effect transistor (GAA FET), and a second GAA FET, Each of the first and second GAA FET includes: a plurality of semiconductor bodies disposed and vertically arranged over a substrate, each of the plurality of semiconductor bodies including a channel region and a source/drain region; and a gate structure wrapping around the channel region of each of the plurality of semiconductor bodies. Th first GAA FET includes a first source contact and a common drain contact, comprising metal or metallic material, and the second GAA FET includes the common drain contact and a second source contact comprising the metal or metallic material, and a bottom of the common drain contact is located below a bottommost one of the plurality of semiconductor bodies. In one or more of the foregoing and following embodiments, the semiconductor device further includes a dielectric liner layer disposed between the common drain contact and the substrate. In one or more of the foregoing and following embodiments, a bottom of the dielectric liner layer is located below a bottommost portion of the gate structure. In one or more of the foregoing and following embodiments, the semiconductor device further includes a silicide layer disposed on a lateral end face of the source/drain region of each of the plurality of semiconductor bodies, and the common drain contact is in contact with the alloy layer. In one or more of the foregoing and following embodiments, the silicide layer disposed on a lateral end face of the source/drain region of one of the plurality of semiconductor bodies is separated by a dielectric inner spacer from the silicide layer disposed on a lateral end face of the source/drain region of an adjacent one of the plurality of semiconductor bodies.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a plurality of semiconductor bodies disposed and vertically arranged over a substrate, each of the plurality of semiconductor bodies including a channel region and a source/drain region;
a gate dielectric layer disposed on and wrapping around the channel region of each of the plurality of semiconductor bodies;
a gate electrode layer disposed on the gate dielectric layer and wrapping around each channel region;
an alloy layer disposed on a lateral end face of the source/drain region of each of the plurality of semiconductor bodies; and
a source/drain contact comprising metal or metallic material in contact with the alloy layer.

2. The semiconductor device according to claim 1, wherein a bottom of the source/drain contact is located closer to the substrate than a bottom face of a bottommost one of the plurality of semiconductor bodies.

3. The semiconductor device according to claim 1, further comprising a dielectric liner layer disposed between the source/drain contact and the substrate.

4. The semiconductor device according to claim 3, further comprising a first inner spacer disposed on a lateral end face of the gate dielectric layer disposed between adjacent semiconductor bodies.

5. The semiconductor device according to claim 4, further comprising a second inner spacer disposed on the first inner spacer and made of a same material as the dielectric liner layer.

6. The semiconductor device according to claim 1, wherein a dopant concentration of the source/drain region gradually increases from the channel region toward the source/drain contact.

7. The semiconductor device according to claim 1, wherein the source/drain contact includes one or more layers of Ti, TiN, Ta, TaN, Co or W.

8. The semiconductor device according to claim 1, wherein the channel region is coupled to the source/drain contact without interposing a semiconductor crystal material having a lattice constant different from the channel region.

9. A semiconductor device comprising:
a substrate including a mesa structure having a bottom fin portion and a source/drain recess portion;
a plurality of semiconductor bodies disposed and vertically arranged over the bottom fin portion, each of the plurality of semiconductor bodies including a channel region and a source/drain region;
a gate structure wrapping around the channel region of each of the plurality of semiconductor bodies;
a source/drain contact comprising metal or metallic material; and
a dielectric liner layer disposed between the source/drain contact and the source/drain recess portion.

10. The semiconductor device according to claim 9, wherein a bottom part of the source/drain contact is located at the source/drain recess portion.

11. The semiconductor device according to claim 9, wherein a bottom of the source/drain contact is located closer to the substrate than a bottom face of a bottommost one of the plurality of semiconductor bodies.

12. The semiconductor device according to claim 9, further comprising a first inner spacer disposed on a lateral end face of the gate structure disposed between adjacent semiconductor bodies.

13. The semiconductor device according to claim 12, further comprising a second inner spacer disposed on the first inner spacer and made of a same material as the dielectric liner layer.

14. The semiconductor device according to claim 12, further comprising a second inner spacer disposed on the first inner spacer and made of a different material than the dielectric liner layer.

15. The semiconductor device according to claim 9, wherein the dielectric liner layer includes silicon nitride.

16. A semiconductor device comprising:
a first gate-all-around field effect transistor (GAA FET); and
a second GAA FET, wherein:
each of the first and second GAA FET includes:
a plurality of semiconductor bodies disposed and vertically arranged over a substrate, each of the plurality of semiconductor bodies including a channel region and a source/drain region; and
a gate structure wrapping around the channel region of each of the plurality of semiconductor bodies,
the first GAA FET includes a first source contact and a common drain contact, comprising metal or metallic material, and the second GAA FET includes the common drain contact and a second source contact comprising the metal or metallic material, and
a bottom of the common drain contact is located below a bottommost one of the plurality of semiconductor bodies.

17. The semiconductor device of claim 16, further comprising a dielectric liner layer disposed between the common drain contact and the substrate.

18. The semiconductor device of claim 17, wherein a bottom of the dielectric liner layer is located below a bottommost portion of the gate structure.

19. The semiconductor device of claim 16, further comprising a silicide layer disposed on a lateral end face of the source/drain region of each of the plurality of semiconductor bodies,
the common drain contact is in contact with the silicide layer.

20. The semiconductor device of claim 19, wherein the silicide layer disposed on a lateral end face of the source/drain region of one of the plurality of semiconductor bodies is separated by a dielectric inner spacer from the silicide layer disposed on a lateral end face of the source/drain region of an adjacent one of the plurality of semiconductor bodies.

* * * * *